(12) United States Patent
Wach

(10) Patent No.: US 8,611,756 B1
(45) Date of Patent: Dec. 17, 2013

(54) HIGHLY INTEGRATED SYSTEM AND METHOD FOR OPTICAL COMMUNICATION

(75) Inventor: Michael L. Wach, Alpharetta, GA (US)

(73) Assignee: Cirrex Systems, LLC, Wilmington, DE (US)

(*) Notice: Subject to any disclaimer, the term of this patent is extended or adjusted under 35 U.S.C. 154(b) by 961 days.

(21) Appl. No.: 12/386,301

(22) Filed: Apr. 16, 2009

Related U.S. Application Data

(60) Provisional application No. 61/124,411, filed on Apr. 16, 2008.

(51) Int. Cl.
*H04B 10/00* (2013.01)
*G02B 6/12* (2006.01)
*G02B 6/10* (2006.01)

(52) U.S. Cl.
USPC ............. 398/140; 385/14; 385/129; 385/130; 385/131

(58) Field of Classification Search
None
See application file for complete search history.

(56) References Cited

U.S. PATENT DOCUMENTS

| | | | |
|---|---|---|---|
| 4,547,210 A * | 10/1985 | Schneider | 65/401 |
| 5,283,844 A * | 2/1994 | Rice et al. | 385/17 |
| 5,621,227 A * | 4/1997 | Joshi | 257/184 |
| 5,661,585 A * | 8/1997 | Feldman et al. | 398/63 |
| 5,963,352 A * | 10/1999 | Atlas et al. | 398/193 |
| 6,490,077 B1 * | 12/2002 | Conradi | 359/334 |
| 2004/0136639 A1 * | 7/2004 | Kondo | 385/14 |
| 2005/0122571 A1 * | 6/2005 | Kim et al. | 359/337 |
| 2006/0239605 A1 * | 10/2006 | Palen et al. | 385/14 |
| 2006/0279734 A1 * | 12/2006 | Yan et al. | 356/329 |
| 2009/0220230 A1 * | 9/2009 | Kim et al. | 398/72 |

FOREIGN PATENT DOCUMENTS

WO WO2007/133000 A1 * 11/2007 ............. H04B 10/13

OTHER PUBLICATIONS

"Continuous Silicon Laser: Interesting Facts," 2005, Intel, 1 p.
"Hybrid Silicon Laser: Interesting Facts," 2006, University of California Santa Barbara, Intel, 2 pp.
Atanackovic, Petar, "Towards a true silicon laser," Feb. 18, 2005, Silex Systems Limited, ASX Announcement, 3 pp.
Fang et al., "Hybrid Silicon Evanescent Devices," Jul.-Aug. 2007, *Materials Today*, 10(7-8): 28-35.
Jalali et al., "Silicon Raman Laser, " Apr. 10, 2005, *Integrated Photonics Research and Applications, Nanophotonics for Information Systems*, Technical Digest (Optical Society of America) ITuC1, 3 pp.

(Continued)

*Primary Examiner* — Ken Vanderpuye
*Assistant Examiner* — Darren E. Wolf
(74) *Attorney, Agent, or Firm* — Fahmi, Sellers, Embert & Davitz

(57) ABSTRACT

A lasing cavity can provide a substantial portion of a path over which data, messages, communication signals, or other information travels from a sender to a recipient. The lasing cavity can support light amplification by stimulated emission of radiation. The sender can be coupled to an input port of the lasing cavity, while the recipient can be coupled to an output port of the lasing cavity. The sender can input information at the input port via applying energy to the lasing cavity, removing energy from the lasing cavity, perturbing the lasing cavity, lengthening the lasing cavity, shortening the lasing cavity, or otherwise inducing a cavity change or a dynamic response. The recipient can receive the information via monitoring the lasing cavity at the output port for changes or responses caused by the sender at the input port.

6 Claims, 8 Drawing Sheets

(56) References Cited

OTHER PUBLICATIONS

Panniccia et al., "A Hybrid Silicon Laser: Silicon Photonics Technology for Future Tera-Scale Computing," Oct. 2006, Technology @Intel Magazine, 9 pp.

Rong et al., "An All-Silicon Raman laser," Jan. 20, 2005, *Nature*, 433:292-294.
Sealy, Cordelia, "World's First All-Silicon Laser," Jan. 2005, *Materials Today*, 1 p.

\* cited by examiner

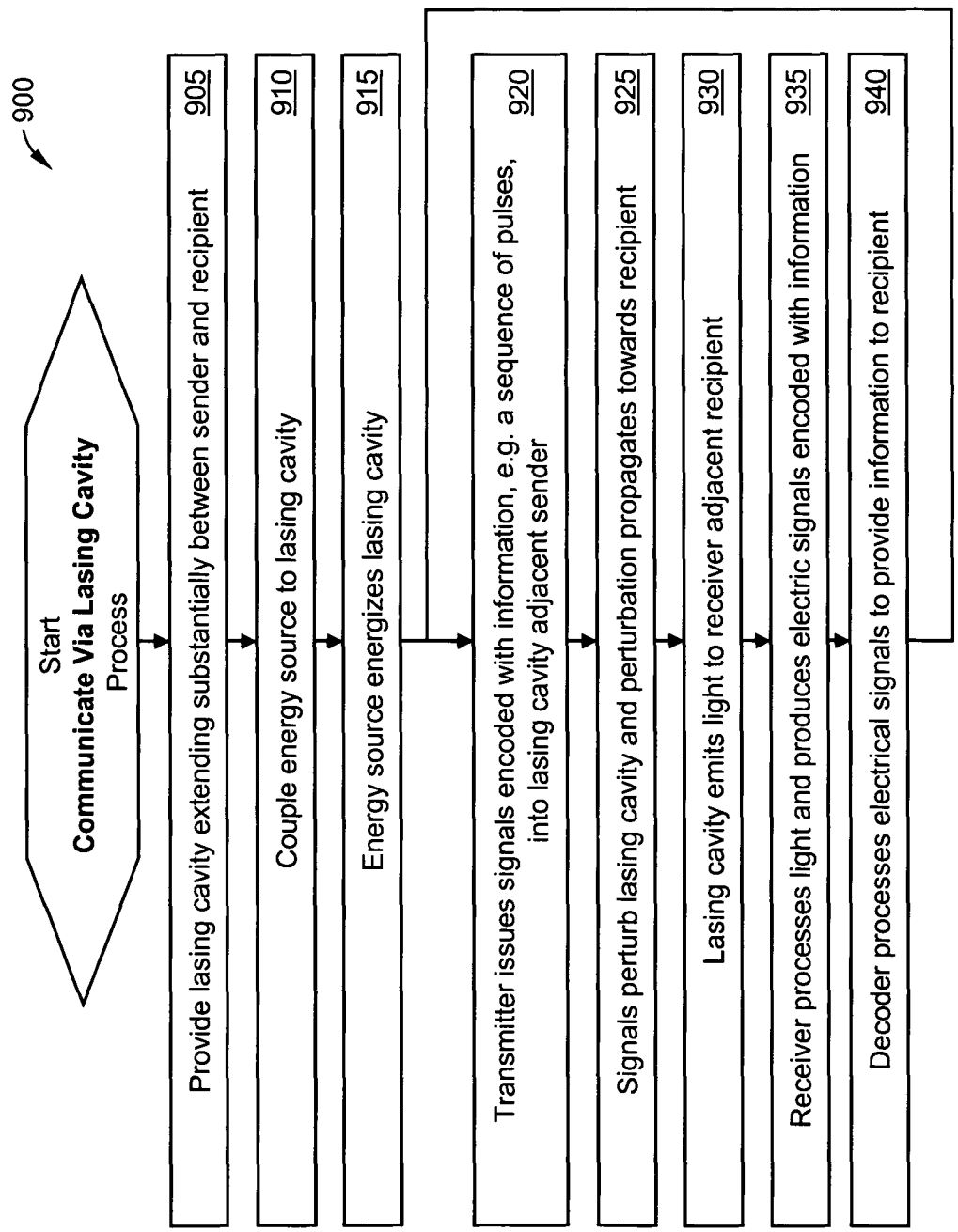

HIGHLY INTEGRATED SYSTEM AND METHOD FOR OPTICAL COMMUNICATION

CROSS REFERENCE TO RELATED APPLICATIONS

This application claims priority to U.S. Provisional Patent Application No. 61/124,411 filed Apr. 16, 2008 in the name of Wach and entitled "Highly Integrated System and Method for Optical Communication," the entire contents of which are hereby incorporated herein by reference.

FIELD OF THE TECHNOLOGY

The present technology generally relates to optical communications and more specifically to communicating via issuing messages onto a lasing cavity and receiving the messages from the lasing cavity, wherein the lasing cavity extends substantially between a message sender and a message recipient.

BACKGROUND

Optical communication involves imprinting or encoding information on light, thereby adapting the light to carry or convey the information as the light propagates or travels between two sites. The two sites may be across the globe or across a country, a state, a town, or a room, for example.

Imprinting or encoding information on light typically involves varying, modulating, or changing some attribute or aspect of the light over time to create a pattern representing the information. A sender or transmitter of the information imposes the pattern on the light, and a receiver of the information identifies the pattern and thereby recovers the information.

For example, sailors on two distant ships may communicate with one another with powerful flashlights. One sailor pulses light on and off in a sequential pattern that represents letters of the alphabet, forming words and sentences, for example in Morse code. The other, distant sailor watches the light and notes the on-off pattern. Knowing the on-off sequences of each letter, that distant observer sailor determines the letters, words, and sentences via reversing the code. While modern fiber optic communication systems are more sophisticated than sailors sending messages to one another with flashlights, the basic concept is generally analogous.

A fiber optic communication system may comprise terminals or users linked together via optical paths, for example in a fiber optic network. Each terminal may comprise a transmitter and a receiver that may be components of a transceiver. Each terminal's transmitter typically outputs light imprinted or encoded with information destined for receipt at another, remote terminal. Meanwhile, each terminal's receiver typically receives light that has been imprinted or encoded with information at another, remote terminal. Accordingly, devices on an optical network can communication with one another via sending and receiving optical signals.

In most conventional optical communication systems, a laser emits the light onto which the information is encoded or imprinted. The encoded light exits the laser and propagates to the information recipient over transmission media that is outside and distinct from the laser. In many circumstances, the encoded light interacts with the transmission media in a manner that obscures the encoding or that otherwise complicates reception by the intended recipient. To mention a few examples, complicating phenomena can include chromatic dispersion, four-wave mixing, polarization mode dispersion, Brillouin scattering chirp, and non-linear interaction between the laser light and the transmission media. Other complications arise as a result of the lasing medium having a composition and optical properties that are significantly different from the transmission media. For example, conventional optical communication system often include an isolator (or a circulator) situated between the laser and the optical transmission media. The isolator prevents light propagating on the optical transmission media towards the laser from entering the laser. Isolators are often discrete devices with size and cost that are incompatible with many potential applications that could otherwise benefit from optical communication technology.

In view of the aforementioned representative deficiencies in the art (or some other related shortcoming), need exists for an improved optical communication system that is compact, that reduces the number or complexity of elements, and/or that integrates an optical transmission medium with a lasing or a gain medium. A technology addressing one or more such needs would benefit optical communications, for example via providing lower cost, better access to higher bandwidth, new applications, reduced size, lower power consumption, higher levels of integration, better manufacturability, etc.

SUMMARY

The present invention can support transmitting, transferring, or communicating information via light, with an optical signal carrying digital or analog information via light propagation. The information can transmit around the globe; across a country, a state, a town, or a room; among core processors of a multi-core microprocessor system; or between devices in an enclosure, on a backplane, within a computer or router chassis, on a circuit board, or in/on a single substrate, to mention a few examples. The information might be a clock pulse or control bits traveling over a bus connecting two or more processing cores, job data transferring among multiple computing elements within a single computer system, information flowing on a backplane within a rack of networking gear, television signals, Internet communications, intranet communications, e-mails, voice, etc.

In one aspect of the present invention, a communication system can comprise a region in which light amplification by stimulated emission of radiation occurs. That region can comprise an optical gain medium disposed or situated between two mirrors or reflectors. As the mirrors reflect light back and forth through the optical gain medium, the optical gain medium can amplify the reflecting light at each pass. In response to the amplification and the resonant reflection, the region can lase. Thus, the region can comprise a lasing cavity or a laser cavity. The region can provide a channel for transmitting communication signals between two sites. A message sender can issue a communication signal at one location on the region. The message recipient can receive the communication signal from another location on the region. In other words, a lasing cavity can extend substantially between two devices, one sending information and one receiving information. The sending device can insert onto the lasing cavity a signal that represents the information, for example perturbing the lasing cavity or causing a transient or some other appropriate response. The receiving device can receive the signal from the lasing cavity, for example sensing or detecting a perturbation or a change that the sending device has induced on the lasing cavity. Accordingly, the lasing cavity can provide a communication channel that extends substantially between an information sender and an information recipient.

The discussion of optical communication presented in this summary is for illustrative purposes only. Various aspects of the present invention may be more clearly understood and appreciated from a review of the following detailed description of the disclosed embodiments and by reference to the drawings and the claims that follow. Moreover, other aspects, systems, methods, features, advantages, and objects of the present invention will become apparent to one with skill in the art upon examination of the following drawings and detailed description. It is intended that all such aspects, systems, methods, features, advantages, and objects are to be included within this description, are to be within the scope of the present invention, and are to be protected by the accompanying claims.

BRIEF DESCRIPTION OF THE DRAWINGS

FIG. 9 is a flowchart of a process for communicating information over an optical path in which lasing occurs in accordance with certain exemplary embodiments of the present invention.

Figure 1:
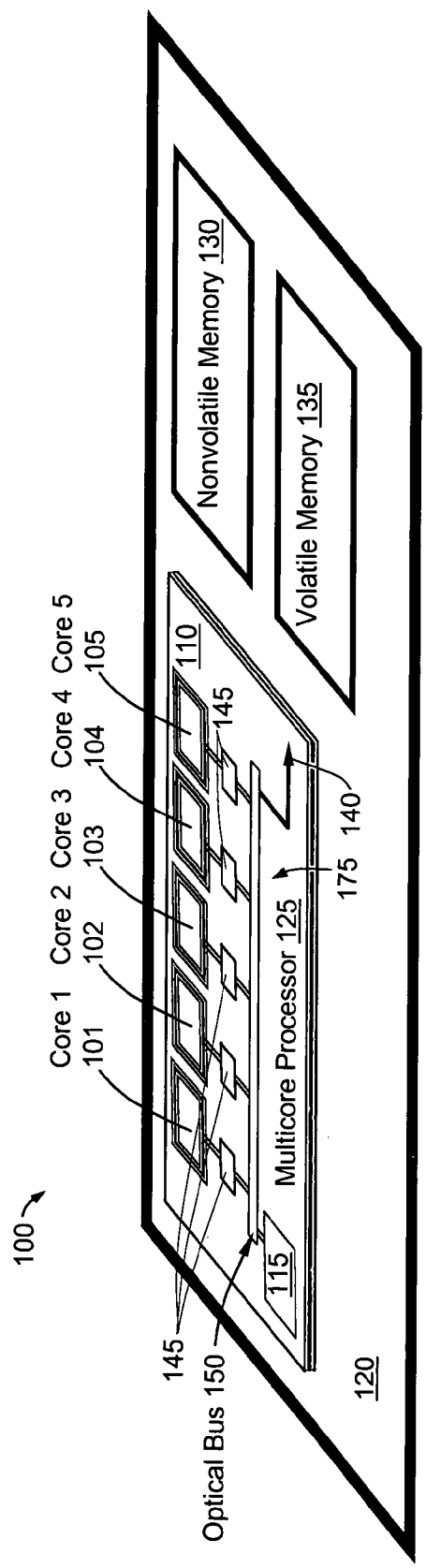
FIG. 1 is a schematic illustration of a microprocessor system comprising a multicore processor that includes an optical network in accordance with certain exemplary embodiments of the present invention.

Many aspects of the present invention can be better understood with reference to the above drawings. The elements and features shown in the drawings are not necessarily to scale, emphasis instead being placed upon clearly illustrating principles of exemplary embodiments of the present invention. Moreover, certain dimensions may be exaggerated to help visually convey such principles. In the drawings, reference numerals designate like or corresponding, but not necessarily identical, elements throughout the several views.

DETAILED DESCRIPTION OF EXEMPLARY EMBODIMENTS

An exemplary embodiment of the present invention can facilitate transmitting and receiving information over a section of waveguide that supports light amplification by stimulated emission of radiation. Certain exemplary embodiments of a system having a lasing cavity comprising an optical communication channel will be described more fully hereinafter with reference to FIGS. 1-9, which depict representative or illustrative embodiments of the present invention.

FIGS. 1, 2, 3, and 8 illustrate examples of computing systems comprising optical communication channels in which lasing occurs over a substantial portion of channel length. FIGS. 4, 5, 6, and 7 illustrate examples of lasing cavities providing such optical communication channels. FIG. 9 illustrates a flowchart for an example of a method or process involving operating such optical communication channels.

The present invention can be embodied in many different forms and should not be construed as limited to the embodiments set forth herein; rather, these embodiments are provided so that this disclosure will be thorough and complete, and will fully convey the scope of the present invention to those having ordinary skill in the art. Furthermore, all "examples" or "exemplary embodiments" given herein are intended to be non-limiting, and among others supported by representations of the present invention.

Turning now to FIG. 1, this figure illustrates a microprocessor system 100 comprising a multicore processor 125 that includes an exemplary optical network 175 according to certain embodiments of the present invention. In the exemplary embodiment of FIG. 1, the optical network 175 transmits information to, from, between, and/or among multiple cores 101, 102, 104, 105 via an optical bus 150. The optical network 175 can comprise a "short range optical interconnect" or an "ultra short range optical interconnect."

The microprocessor system 100 comprises a substrate 120 that supports the multicore processor 125, volatile memory 135, and nonvolatile memory 130. The substrate 120 can comprise a motherboard, with the volatile memory 135 and the nonvolatile memory 130 comprising respective daughter boards. In certain exemplary embodiments, the substrate 120 comprises a ceramic wafer or plate upon which the other illustrated components are mounted in a unitary package. The substrate 120 can also comprise a slide-in board or a "blade," for example. In some exemplary embodiments, the volatile memory 135, the nonvolatile memory 130, and the multicore processor 125 are mounted via ball grid array ("BGA") technology, a "pin grid array" system, surface mounting, solder, etc. Alternatively, the volatile memory 135, the nonvolatile memory 130, and the multicore processor 125 can be grown on the substrate 120. The microprocessor system 100 can be a monolithic device. In certain exemplary embodiments, the microprocessor system 100 can be a very large scale integrated ("VLSI") chip. In certain exemplary embodiments, the volatile memory 135, the nonvolatile memory 130, and the multicore processor 125 can be features on the substrate 120, created via photolithography, for example.

The multicore processor 125 exchanges information with the nonvolatile memory 130 and the volatile memory 135 via the communication line 140, for example accessing programming instructions, code, data, etc. Accordingly, the communication line 140 typically provides a link between the multicore processor 125 and the volatile and nonvolatile memories 130, 135.

The microprocessor system 100 could be a computing system or engine for a personal computer, a laptop, a minicomputer, a router, a communication terminal, a handheld computer, a cellular telephone, a workstation, a gaming device, or some other appropriate computing, communication, or entertainment system or apparatus, for example. Thus, a wide variety of a larger systems can comprise the microprocessor system 100.

While the multicore computer processor application of FIG. 1 illustrates a representative example, various embodiments of the present invention can support other applications and operating environments. The disclosure and teachings presented herein would enable one of ordinary skill in the art to utilize instances, variations, and adaptations of the optical network 175 for a broad variety of optical networking systems, optical communication applications, and computing devices. Such systems and applications can include wide area networks ("WANs"), local area networks ("LANs"), metropolitan area networks ("MANs"), fiber to the home ("FTTH"), fiber to the curb ("FTTC"), fiber to the whatever ("FTTX"), fiber to the premises ("FTTP"), access networks, intra-cabinet communications, backplane communications, intra-computer communications, inter-computer communications, intra-core communications, buses for digital signal processors ("DSPs"), buses for systems on a chip ("SOCs"), chip-to-chip optical interconnects, core-to-core optical interconnects, optical links between or among features on a single chip, optical lines in multi-chip modules ("MCMs") and microprocessor buses, to mention a few examples. Further, such an optical network 175 can be part of a larger network that may span across a country, a state, or a significant geographic region. Appropriately outfitted, the optical network 175 can connect nodes or sites within a LAN, a home network, an FTTH network, an access network, or one or more communication links within a local area (not an exhaustive list). Embodiments of the optical network 175 can be essentially or substantially contained within a single piece of equipment, in a single enclosure, or in a singe package such as a dual inline pin ("DIP") package.

In certain exemplary embodiments, the optical network 175 is disposed on or is attached to a single substrate 110, for example to connect cores 101, 102, 104, 104, 105 of the multicore processor 125 or computing elements of a larger microprocessor system (or computing processor). Such a singe substrate 110 can comprise (or consist of) silicon, for example in a "silicon-on-insulator" format or as a monolithic platform.

In one exemplary embodiment, the optical network 175 can comprise a unitary optical path that links two users together, without supporting additional user connections. As one more example out of many possibilities, the optical network 175 may provide one or more optical interconnects or optical links for a backplane or an optical bus that transmits information within communications or computing equipment. Accordingly, exemplary embodiments of the present invention can support a wide variety of communication devices or systems.

In one exemplary embodiment, the multicore processor 125 and/or the microprocessor system 100 comprises multiple components, elements, or material systems in a common enclosure or housing. Such an enclosure or housing can comprise a MCM package, a plug-in module, or a BGA system, for example. The multicore processor 125 and/or the microprocessor system 100 can comprise various discrete electrical, digital, electronic, optical, and optoelectronic components. In certain exemplary embodiments, optical, optoelectronic, and electrical circuitry elements discussed below are provided in a common material system such as lithium niobate, silicon, or indium phosphide. Furthermore, those optical, optoelectronic, and electrical circuitry elements can be grown on a common substrate 110 and/or monolithic. In one exemplary embodiment, the multicore processor 125 comprises a planar lightguide/lightwave circuit ("PLC") or a photonic integrated circuit ("PIC"). Thus, a PLC or a PIC can provide a platform for the multicore processor's optical, optoelectronic, and electrical circuitry elements, as discussed below.

In certain exemplary embodiments, components of the multicore processor 125 can be mounted on a substrate 110, such as a plate, block, sheet, wafer, or slab of material, having a composition of glass, silica, sapphire, aluminum oxide, ceramic, or silicon, for example. In one exemplary embodiment, those components are integrated in or grown on a semiconductor material, such as a silicon-based material, InGaAs, germanium, InP, III-V material, III-V semiconductor material, etc. Those components can be either monolithically integrated or hybrid integrated, for example. Moreover, they can be grown on, embedded in, or bonded to a common substrate 110. Accordingly, the multicore processor's optical, optoelectronic, and/or electronic components can be a unitary structure, a monolithic system, a "chip," or a collection of elements fastened or bonded together.

The multicore processor 125 comprises multiple cores 101, 102, 103, 104, 105 to implement multiprocessing in a single package or on a single system. In an exemplary embodiment, the multicore processor 125 can be a central processing unit ("CPU"). Alternatively, the microprocessor system 100 can be a CPU, with the multicore processor 125 being a heart of the CPU. In an exemplary embodiment, each of the cores 101, 102, 103, 104, 105 may implement optimization, for example multithreading, pipelining, or superscalar execution. Such multithreading can comprise having two or more threads of execution, each providing a way for a program to fork to multiple tasks that are running simultaneously, substantially simultaneously, or pseudo-simultaneously. Different threads and processes can run literally simultaneously on each of the different cores 101, 102, 103, 104, 105. That is, one of the cores 101, 102, 103, 104, 105 can run one thread or process, while another of the cores 101, 102, 103, 104, 105 runs another thread or process.

In certain exemplary embodiments, the cores 101, 102, 103, 104, 105 are all on a single die, so that the multicore processor 125 is a monolithic processor. Moreover, the optical network 175, the optical bus 150, and the bus interfaces 145 (discussed below) can be on the single die, so that the complete multicore processor 125 is monolithic or grown on a common substrate 110 of silicon or other suitable material. The multicore processor 125 can be a VLSI chip, for example. The multicore processor 125 can comprise a substrate 110 with a substantially flat or planar surface or face, with the optical network 175, the optical bus 150, and the bus interfaces 145 attached thereto. In some exemplary embodiments, each of the cores 101, 102, 103, 104, 105 is a discrete element attached to a substrate 110, while in other exemplary embodiments, each of the cores 101, 102, 103, 104, 105 comprises chip-level features defined on a common substrate 110, for example via photolithography.

As will be discussed in further detail below, the optical network 175 comprises the optical bus 150 that supports communications between, among, or with each of the cores 101, 102, 103, 104, 105 as well as the cache 115 and the communication line 140. In other words each of the cores 101, 102, 103, 104, 105 can send and/or receive information over the optical bus 150. Thus, the optical bus 150 provides one or more communication channels. Information flowing over the optical bus 150 can coordinate or synchronize operations of the cores 101, 102, 103, 104, 105; allocate processing jobs, threads, tasks, or pipelines among the cores 101, 102, 103, 104, 105; deliver timing pulses; communicate processing results or inputs; or provide some other appropriate information, data, or support for operating the multicore processor 125.

In one exemplary embodiment, the bus interfaces 145 may comprise core identifiers for identifying each of the cores 101, 102, 103, 104, 105 for the optical bus 150. In other words, each bus interface 145 can specify a unique network address of its associated core 101, 102, 103, 104, 105. In one exemplary embodiment, each bus interface 145 comprises an optical element, such as a grating with unique spectral properties. In one exemplary embodiment, each bus interface 145 assigns a specific spectral window to a respective one of the cores 101, 102, 103, 104, 105. Alternatively, each bus interface 145 can provide identification from the electrical domain. For example, each bus interface 145 can comprise a system of electrical circuitry that provides a core ID register. More generally, each bus interface 145 (respectively denoted 145A, 145B, 145C, 145D, 145E in FIG. 2) provides its associated core 101, 102, 103, 104, 105 with an interface to the optical bus 150 to support bus access, as described in further detail below.

Figure 2:
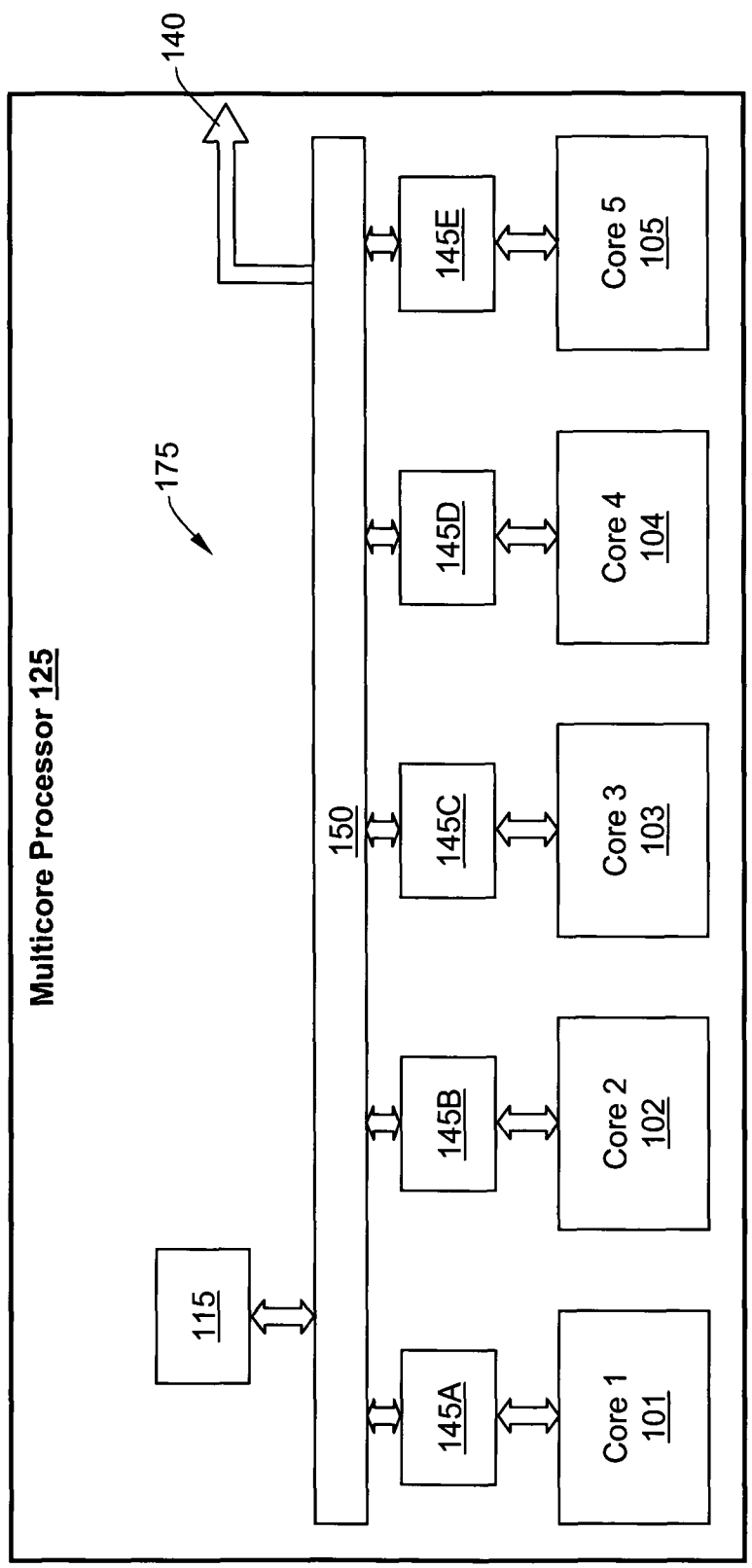
FIG. 2 is a functional block diagram of a multicore processor comprising cores attached to an optical network in accordance with certain exemplary embodiments of the present invention.

Referring now to FIG. 2, this figure illustrates a functional block diagram of an exemplary multicore processor 125 comprising cores 101, 102, 103, 104, 105 attached to an optical network 175 according to certain embodiments of the present invention. In an exemplary embodiment, FIG. 2 illustrates the multicore processor 125 of FIG. 1 in further detail. In other words, FIG. 2 provides an exemplary block diagram for an exemplary embodiment of the multicore processor 125 that FIG. 1 illustrates as discussed above.

Figure 3:
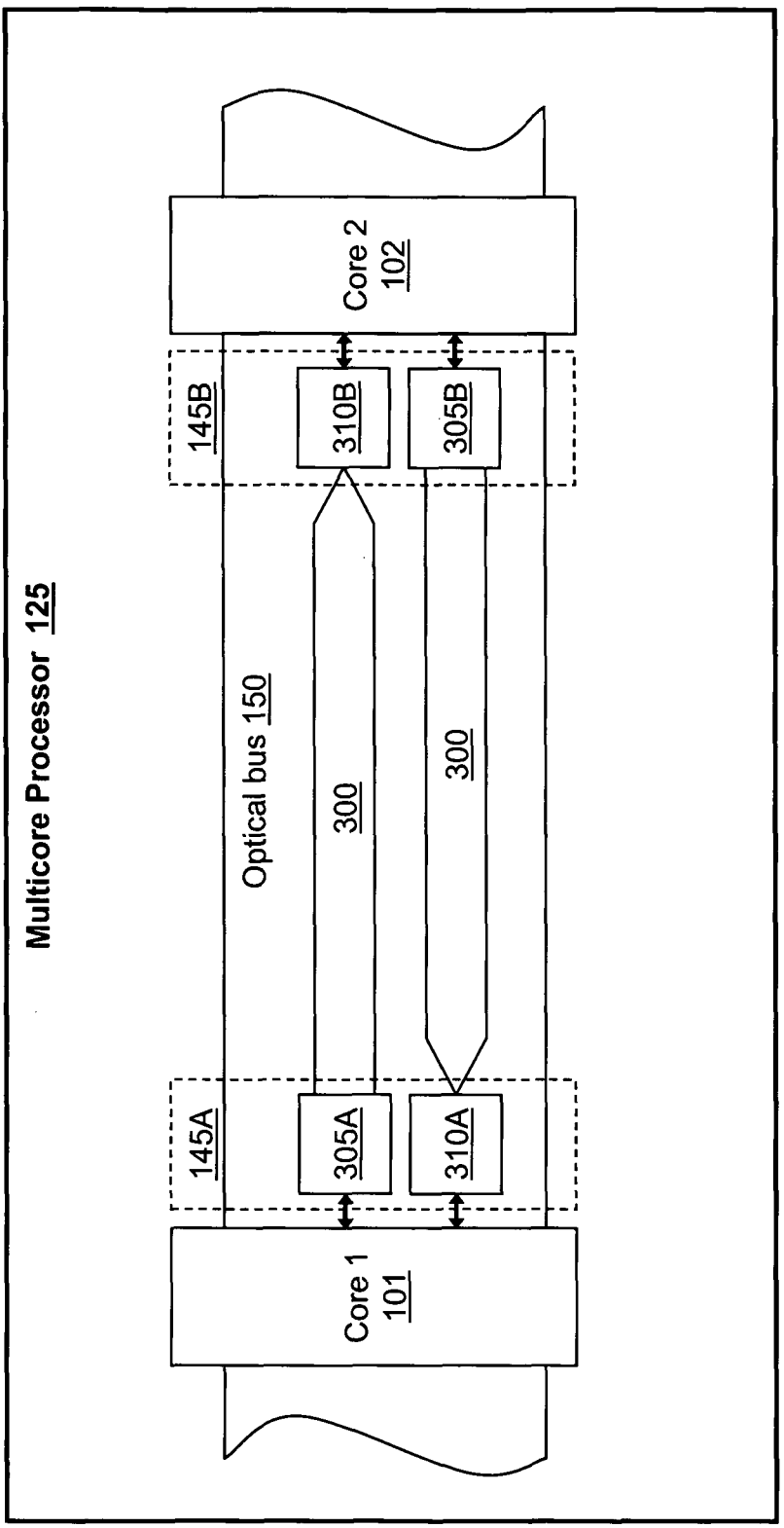
FIG. 3 is a functional block diagram of a section of an optical network comprising a lasing cavity that provides an optical channel extending between cores of a multicore processor in accordance with certain exemplary embodiments of the present invention.

Turning now to FIG. 3, this figure illustrates a functional block diagram of an exemplary section of an optical network 175 comprising an exemplary lasing cavity 300 that provides an optical channel extending between cores 101, 102 of a multicore processor 125 according to certain embodiments of the present invention. FIG. 3 can be viewed as a schematic-type diagram illustrating an exemplary embodiment of the multicore processor 125 illustrated in FIG. 1 (or FIG. 2 or FIGS. 1 and 2) as discussed above. FIG. 3 specifically illustrates a section of the optical bus 150 extending between core 1 101 and core 2 102.

In various exemplary embodiments, a representative few of which are discussed below in detail, the lasing cavity 300 and its supporting elements can comprise one or more distributed feedback "DFB" lasers, distributed Bragg reflector ("DBR") lasers, fiber-Bragg grating lasers, hybrid silicon lasers, Fabry-Perot lasers, vertical-cavity surface-emitting lasers ("VCSELs"), fiber lasers, Raman lasers, semiconductor lasers, mono-mode lasers, single-mode lasers, mode-locked lasers, external cavity lasers, extended cavity lasers, multiple quantum well ("MQW") lasers, lasers that comprise a capped mesa buried hetero-structure ("CBMH") grown on an n-type substrate with MQW active layers and a DFB grating layer, diode lasers, quantum dot lasers, quantum dash lasers, silicon lasers, "silicon-photonic" lasers, optical pumped lasers that can comprise silicon, compound semiconductor lasers, strained quantum well lasers, edge emitting lasers, frequency doubling lasers, separate confinement heterostructure quantum well lasers, buried heterostructure diode lasers, quantum cascade lasers, multimode lasers, lasers that lase at multiple longitudinal modes, or lasers that lase at multiple transverse modes (not an exhaustive list).

The bus interface 145A comprises a transmitter 305A for feeding information from the core 1 101 onto the lasing cavity 300 that extends from the bus interface 145A to the bus interface 145B. Thus, the bus interface 145A applies signals to that lasing cavity 300 via an input port or an inlet. The bus interface 145A also comprises a receiver 310A for the core 1 101 to receive information from the lasing cavity 300 that extends from the bus interface 145B to the bus interface 145A. Thus, the bus interface 145A receives signals from that lasing cavity 300 via an output port or an outlet. In an exemplary embodiment, the bus interface 145B can comprise (or can be) a transceiver that applies signals to and receives signals from at least one lasing cavity 300.

The term "transceiver," as used herein, generally refers to a system that receives optical communication signals and transmits optical communication signals, each conveying distinct information. Receiving optical communication signals often comprises converting or transferring information from the optical domain to the electrical domain. Transmitting optical communication signals often comprises converting or transferring information from the electrical domain to the optical domain. Accordingly, in an exemplary transceiver, optically encoded information may become electrically encoded information, and electrically encoded information may become optically encoded information.

The term "port," as used herein, generally refers to a place of entry or exit, a passageway, an inlet or an outlet, an entrance or an exit, an input or an output, a connection, a connection point, a passage, or a line through which signals (for example optical or electrical) or data transmit into and/or out of a device or a system.

Similar to the bus interface 145A, the bus interface 145B provides a facility for the core 2 102 to transmit information on and to receive information from the optical bus 150. The transmitter 305B applies signals bearing information from the core 2 102 onto (or into) the associated lasing cavity 300. The receiver 310B receives signals, bearing other information, from the associated lasing cavity 300 for the core 2 102.

Accordingly, the core 1 101 and the core 2 102 communicate with one another via the transmitters 305A, 305B and the receivers 310A, 310B associated with the bus interfaces 145A, 145B.

Figure 4:
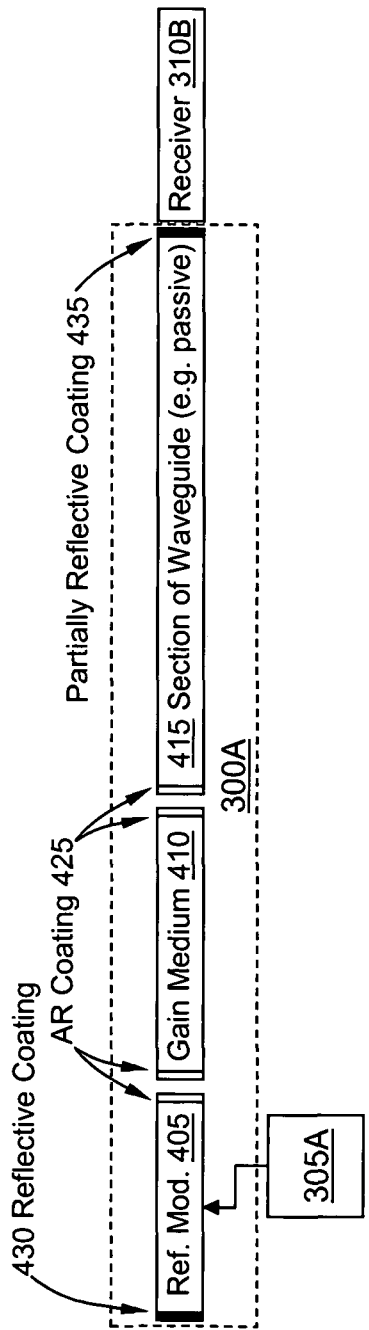
FIG. 4 is a schematic of a lasing cavity providing an optical communication channel in accordance with certain exemplary embodiments of the present invention.

Turning now to FIG. 4, this figure illustrates a schematic of an exemplary lasing cavity 300A providing an optical communication channel according to certain embodiments of the present invention. The lasing cavity 300A that FIG. 4 illustrates provides an exemplary embodiment of each of the lasing cavities 300 illustrated in FIG. 3 and discussed above.

The exemplary lasing cavity 300A comprises a section of waveguide 415 that extends from a gain medium 410 to the receiver 310B. The section of waveguide 415 can comprise structures or features imprinted, grown, or integrated on a substrate 110 (see FIG. 1), for example comprising crystalline silicon. In certain exemplary embodiments, the waveguide 415 is a silicon on insulator waveguide and/or a rib waveguide.

The term "waveguide," as used herein, generally refers to a device or structure that directs, controls, or steers light to flow along a path, course, route, or channel and confines, limits, or binds the light so the light generally says on or in the path, course, route, or channel. An optical waveguide can comprise one or more structures that guide and/or generally confine light during transmission. For example, such an optical waveguide can comprise an elongate or elongated section of optical material having a refractive index that is high relative to an adjacent material, such as a cladding. In this configuration, the cladding helps keep the light on course. Another type of waveguide can comprise a material with a pattern of structures, such as holes, that help transmitting light maintain a prescribed course of travel without unwanted or excessive divergence or loss. Such a waveguide embodiment can be a "holey fiber" or a "photonic crystal fiber," for example.

In certain exemplary embodiments, the section of waveguide 415 is substantially passive so that the section of waveguide 415 generally avoids adding energy to the stream of light during propagation within the section of waveguide 415. Alternatively, the section of waveguide 415 can be active, for example intensifying the light propagating within or actively manipulating that light.

The end of the section of waveguide 415 facing the receiver 310B comprises a reflector, exemplary embodied in a partially reflective coating 435. For example, the section of waveguide 415 can comprise a discrete optical fiber or a PLC waveguide having a thin film coating on the end face of the PLC that reflects a substantial portion of the light incident thereon.

The opposite end of the section of waveguide 415 comprises an antireflective ("AR") coating 425 as an exemplary embodiment of a provision for inhibiting or managing reflection of incident light. Accordingly, light passes freely through (into and out of) the end of the section of waveguide 415 that faces the gain medium 410. As an alternative to an AR coating 425, that end of the section of waveguide 415 can have an angled end face, a grating, a motheye pattern, a coupling material, an index-matching medium, or some other means for managing or suppressing reflection.

The gain medium 410 amplifies passing light. Light that has reflected from the partially reflective coating 435 intensifies as it transmits through the gain medium 410.

In one exemplary embodiment, the gain medium 410 is a Fabry-Perot laser (or laser die) with end facets having AR coatings 425 or some other reflection suppression technology, for example as discussed above. That is, the gain medium 410 can be provided by applying AR coatings 425 to the end faces of a Fabry-Perot laser die. With the AR coatings 425, the Fabry-Perot laser die lases in response to light reflecting from the partially reflective coating 435 and the reflective coating 430, rather than from reflection of the die facet.

In one exemplary embodiment, the gain medium 410 is a semiconductor optical amplifier ("SOA"). In one exemplary embodiment, the gain medium 410 is a silicon optical amplifier ("SiOA"). In one exemplary embodiment, the gain medium 410 is optically pumped. In one exemplary embodiment, the gain medium 410 is energized via electrical energy. In one exemplary embodiment, the gain medium 410 amplifies via Raman scattering or the Raman effect. In one exemplary embodiment, the gain medium 410 comprises an edge emitter or an edge emitting diode. In one exemplary embodiment, the gain medium 410 comprises a semiconductor gain medium. In various embodiments, the gain medium 410 can comprise silicon, a MQW laser diode or structure, a capped mesa buried hetero-structure, a strained quantum well laser diode, a vertical-cavity surface-emitting laser or structure, a quantum dot laser structure, a plurality of quantum dots, a silicon photonic device, a buried heterostructure laser diode, a quantum cascade device, a compound semiconductor element, or some other appropriate material or structure (not an exhaustive list).

In various exemplary embodiments, the gain medium 410 can comprise gallium aluminum arsenide, indium gallium arsenide phosphide ("InGaAsP"), gallium arsenide, indium phosphide (InP) adapted to provide a tailored gain profile, InGaAsP (1-1.8 microns), GaAsSb (1-1.6 microns), AlGaAs (0.7-0.9 microns), GaAsP (0.6-1 microns), AlGaInP (0.6-0.7 microns), InGaAs (0.6-3 microns), GaInN (0.35-0.7 microns), CdZnS (0.3-0.5 microns), InAs/InP, InGaAsP/InP, InGaAsP/InP, InGaAsP/InP, InGaAsP/InP, GaAs, GaAs/AlGaAs, AlInGaAs, InGaAs material and quantum dots, GaInN(Sb)As, AlGaAsSb, or InP base material with InGaAsP layers manufactured by molecular beam epitaxy ("MBE") or metal organic chemical vapor deposition ("MOCVD") (not an exhaustive list).

Opposite the section of waveguide 415, the gain medium 410 is optically coupled to a refractive index modulator 405. The end of the refractive index modulator 405 facing the gain medium 410 is treated with an AR coating or is provided with some other reflection management or suppression technology, for example as discussed above. Likewise the end of the gain medium 410 facing the refractive index modulator 405 comprises a provision for managing reflection, for example an AR coating. The opposite end of the refractive index modulator 406 includes a reflective coating 430 or some other appropriate feature for reflecting light.

In various exemplary embodiments, the reflective coating 430 and the partially reflective coating 435 can respectively provide reflectivities of: 99 and 70, 98 and 70, 98 and 65, 95-100 and 50-60, 95-100 and 60-70, 95-100 and 70-80, 95-100 and 80-90, 90-99 and 60-80, 99 and 55, 98 and 60-65, or 99-100 and 80-85, to mention several possibilities without providing all options, wherein the reflectivity numbers are approximate percentages. The reflectivity selections can depend upon the material selection, cavity length, and application parameters, for example.

Light resonates, circulates, or bounces back and forth between the partially reflective coating 435 and the reflective coating 430. Successive passes through the gain medium 410 amplify light, thus causing laser light to emit through the partially reflective coating 435 for receipt by the receiver 310B. Those successive passes typically appear as a standing wave. In other words, the reflective coating 430 and the partially reflective coating 435 provide optical feedback to produce lasing action. Thus, the partially reflective coating 435 and the reflective coating 430 provide a lasing cavity, a laser cavity, or a resonant cavity for light amplification and stimulated light emission.

Each of the terms "lasing cavity" and "laser cavity," as used herein, generally refers a system (typically a structure or a region) for circulating light through one medium or multiple media that amplify light to produce laser light. Circulating light can comprise reflecting light back and forth, resonating light waves, setting up a standing light wave, establishing a resonant pattern of electromagnetic radiation, feeding light back on itself, or running light through a circuit (one, two, or three dimensional) so the light circles, folds, or loops back on itself, for example. Geometrically, a lasing cavity or a laser cavity can be linear, circular, figure eight, or spherical, to mention a few possibilities. A laser cavity or a lasing cavity can be an arrangement (typically but not necessarily of mirrors or other reflectors) for inducing a material to produce laser light via feedback of laser light. A laser cavity or a lasing cavity can be an optically resonant structure in which lasing activity begins when multiple light passes (or light reflections) accumulate electromagnetic field intensity. Thus, a typical laser cavity or lasing cavity of a laser is a region of the laser in which light sets up a substantially standing wave in support of light amplification by stimulated emission of radiation. The usage of these terms herein and the explanation of this paragraph are believed to be consistent with current, generally accepted industry terminology.

The exemplary lasing cavity 300A of FIG. 4 extends from the reflective coating 430 at the rear of the refractive index modulator 405 to the partially reflective coating 435 at the front of the section of waveguide 415. The refractive index modulator 405 produces a change in refractive index in response to an input signal from the transmitter 305A. Thus, the transmitter 305A applies a signal to the refractive index modulator 405 of the lasing cavity 300A. The signal conveys information, for example comprising a pulse or a change in amplitude that triggers some response from the core 2 102. A series of such signals might represent a sound, an image, voices, video, text, numbers, or a set of computer executable instructions, for example. The signal might also be a timing cue for synchronizing activities across multiple cores 101, 102, 103, 104, 105.

In certain exemplary embodiments, the refractive index modulator 405 comprises an optical waveguide segment and an associated electrode. The electrode provides or applies a modulated electric field to the optical waveguide segment. The electric field varies the refractive index of the optical waveguide segment. That is, the refractive index of that optical waveguide segment changes under control of the transmitter 305A. The refractive index modulator 405 can comprise lithium niobate that responds to an electric field. For example, the refractive index modulator 405 can be one leg from a Mach-Zehnder interferometer modulator.

In one exemplary embodiment, the refractive index modulator 405 is provided via modifying a commercially available Mach-Zhender modulator having a lithium niobate composition. One leg of such a commercially available modulator can be disabled via laser ablation, laser drilling, or reactive ion etching. The remaining, active leg can be used as the refractive index modulator 405. More typically, however, one of ordinary skill can readily provide the refractive index modulator 405 for the specific application depicted in FIG. 4 using commercially available optical software and design tools based on the present disclosure and teaching of this paper.

In one exemplary embodiment, the refractive index modulator 405 applies an electrical field (or a voltage or an electromagnetic field) to an associated optical waveguide segment, for example via an electrode. The optical waveguide segment responds to the applied electric field and undergoes a refractive index change. The optical waveguide segment can comprise $LiNbO_3$, for example. Other material options include barium titanate, bismuth silicate, and strontium barium niobate. The change in refractive index provides a corresponding change in the speed of light, thereby producing a variable level or amount of delay (and that provides a corresponding shift in phase). If the applied electrical field has two or more discrete states, then the phase shift can likewise be discrete. On the other hand, if the change in intensity of the electric field is essentially gradual or continuous, then the phase shift also varies smoothly.

In one exemplary embodiment, the refractive index modulator 405 (and/or the transmitter 305A) produces a change in refractive index (and optical path length and phase shift) via applying a magnetic field to its associated optical waveguide segment.

In one exemplary embodiment, the refractive index modulator 405 (and/or the transmitter 305A) comprises a light source that delivers luminous energy to its associated optical waveguide segment. The delivered light energy can produce a change in refractive index (and corresponding changes in phase shift or optical path length). The optical waveguide segment can be fabricated from light sensitive polymeric materials or a photorefractive polymer, for example. Such material can be a constituent of the waveguide's core or of the waveguide's cladding. In one exemplary embodiment, the material comprises 2-cyclooctylamino-5-nitropyridine doped with 7,7,8,8-tetracyanoquinodimethane. In one exemplary embodiment, the material comprises poly(N-vinylcarbazole) with an electrooptic guest molecule such as 3-fluoro-4-(diethylamino)-(E)-β-nitrostyrene. In one exemplary embodiment, the material comprises a photo-conducting polymer doped with nonlinear optical chromophores, such as a boron derivative nonlinear chromphore.

In certain exemplary embodiments, the dynamic response or sensitivity of the lasing cavity 300A facilitates sending information via relatively subtle or weak changes in refractive index. In an exemplary embodiment, the lasing cavity 300A is sensitive to perturbations or can be easily perturbed. The heightened sensitivity supports imprinting information on light with phenomena that affect materials relatively subtly. Thus, the lasing cavity 300A can pickup and respond to small changes in refractive index that can be produced with light or with other stimuli that might otherwise be ill suited for modulating an optical signal. For example, in an exemplary embodiment, one light can imprint information on another light. That is, a control light can induce a very small change in refractive index of an optical waveguide segment in the refractive index modulator 405, and the lasing cavity 300A can respond to (or amplify) that very small change in refractive index in a manner that the receiver 310B can discern or detect.

The change in refractive index produced by the refractive index modulator 405 changes the lasing cavity 300A in a manner that affects the light emitted through the partially reflective coating 435 into the receiver 310B. For example, the change in refractive index causes the "optical length" of the lasing cavity 300A to increase or to decrease. While the physical length of the lasing cavity 300A may remain essentially constant, the change in refractive index causes the length of the lasing cavity 300A to change from the perspective of the light transmitting therein. In other words, the change in refractive index of the refractive index modulator 405 results in a change in the speed of the light propagating through the refractive index modulator 405. Thus, the residence time of the light in the refractive index modulator 405, and thus in the lasing cavity 300A, changes.

These changes cause a shift in the cavity modes of the lasing cavity 300A. The lasing cavity 300A has specific wavelengths (or frequencies) of resonance. If the lasing cavity 300A is energized below the lasing threshold, the wavelengths of resonance can resemble a "comb" when viewed on a optical spectrum analyzer. Each peak in the comb indicates a wavelength at which the lasing cavity 300A may lase under appropriate conditions. When the refractive index modulator 405 changes the refractive index of a portion of the lasing cavity 300A, the comb shifts. Under lasing conditions, the change in refractive index causes a shift in the lasing wavelength. Accordingly, the color, wavelength, or frequency of the light output to the receiver 310B shifts, changes, or dithers. These changes can also manifest themselves in phase shifts.

In an alternative explanation, the transmitter 305A triggers the refractive index modulator 405 to implement a refractive index change (for example abruptly between at least two or more discrete levels or gradually in an analog or continuous manner). The refractive index change causes a shift in the wavelength of the light the lasing cavity 300A outputs to the receiver 310B. (The shift may be either abrupt or gradual depending upon how the refractive index changed and upon the dynamic response of the lasing cavity 300A.)

The receiver 310B analyzes the light output by the lasing cavity 300A to identify changes attributable to actions of the transmitter 305A (and thus conveying information intended for receipt). In one exemplary embodiment, the receiver 310B comprises a spectrometer for conducting the light analysis. For example, the receiver 310B can disperse the light and direct the dispersed light to an array of detectors, so that different detectors are illuminated (and thus emit electrical signals) according to the state of the light. In one exemplary embodiment, the receiver 310B comprises an interferometer for conducting light analysis. Such an interferometer might be a Fabry-Perot interferometer, a Michelson interferometer, a Mach-Zehnder interferometer, or a Sagnac interferometer, for example. In one exemplary embodiment, the receiver 310B comprises an arrayed waveguide grating ("AWG") for conducting the light analysis. In one exemplary embodiment, the receiver 310B comprises a detector that converts optical signals from the lasing cavity 300A into corresponding electrical signals, and a substantial portion of the analysis is conducted on those electrical signals, for example via a high-speed analog circuit. In one exemplary embodiment, the receiver 310B comprises an optical spectrum analyzer, for analyzing the light as may be available from Agilent, Ando/Yokogawa, Anritsu, or JDSU.

In certain exemplary embodiments, the transmitter 305A receives data in the form of a sequence of ones and zeros. The transmitter 300A controls the refractive index of the refractive index modulator 405 according to the sequence of ones and zeros. For each zero, the transmitter 300A sets the refractive index modulator 405 to a low refractive index. For each one, the transmitter sets the refractive index modulator 405 to a high refractive index. The optical length of the optical cavity 300A thus has two states, one for each zero in the sequence, and one for each one in the sequence. The optical signal emitted from the optical cavity 300A to the receiver 310B comprises a sequence of wavelength changes. For each zero in the sequence, one wavelength of light is incident upon the receiver 310. And for each one in the sequence, another wavelength of light is incident upon the receiver 310. Thus, the system of FIG. 4 converts a sequence of discrete changes in electrical intensity to a sequence of discrete changes in wavelength of laser light. The receiver 310 distinguishes the different wavelengths via dispersion, for example with a diffraction grating or even a prism. Such a dispersive element causes the light of each of the wavelengths to take different paths. (The process is analogous to separating sunlight into constituent colors via shining the sunlight through an ordinary prism.) A detector array, disposed in the two different light paths, picks up the dispersed light. The wavelength of the incident light is readily determined according to which detector elements in the detector array are illuminated. At the wavelength of each zero in the sequence, one set of detector elements is illuminated (and thus emits a corresponding electrical signal). At the wavelength of each one in the sequence, a different set of detector elements are illuminated (and thus emits a corresponding electrical signal). (Each set may be one, two, or more detector elements.) Accordingly, the electrical output of the detector array readily identifies the data transmitted by the transmitter 305A according to which detectors elements in the detector array are emitting electrical signals.

In one exemplary embodiment, the lasing cavity 300A is itself an interferometer, for example a Mach-Zehnder interferometer. As an interferometer, the lasing cavity 300A can have a dual function of transmitting communication signals and splitting the transmitted communication signals to facilitate detection by the receiver 310B. The receiver 310 B can comprise a plurality of detectors or a detector array.

In one exemplary embodiment, an electroabsorption modulator ("EAM") is substituted for the refractive index modulator 405. In this case, the transmitter 305A prompts the EAM to change the optical properties of the lasing cavity 300A, for example via adding loss. The lasing cavity 300A may respond with a change in the intensity of the output signal to the receiver 310B. The receiver 310B can detect such an intensity change without necessarily performing a spectral analysis. In one exemplary embodiment, the transmitter 305A issues signals that cause the lasing cavity 300A to ring or to "ring down," and the receiver 310B picks up the effect as a source of information.

In certain exemplary embodiments, the length of the lasing cavity 300A and/or the physical distance between the transmitter 305A and the receiver 310B are each less than about 10,000 times the wavelength of the light or the information-bearing optical signals received by the receiver 310B. In certain exemplary embodiments, the length of the lasing cavity 300A and/or the physical distance between the transmitter 305A and the receiver 310B are each less than about 100,000 times the wavelength of the light or the information-bearing optical signals received by the receiver 310B. In certain exemplary embodiments, the length of the lasing cavity 300A and/or the physical distance between the transmitter 305A and the receiver 310B are each less than about 5,000 times the wavelength of the light or the information-bearing optical signals received by the receiver 310B. In certain exemplary embodiments, the length of the lasing cavity 300A and/or the physical distance between the transmitter 305A and the receiver 310B are each less than about 2,000 times the wavelength of the light or the information-bearing optical signals received by the receiver 310B. In certain exemplary embodiments, the length of the lasing cavity 300A and/or the physical distance between the transmitter 305A and the receiver 310B are each less than about 1,000 times the wavelength of the light or the information-bearing optical signals received by the receiver 310B. In certain exemplary embodiments, the length of the lasing cavity 300A and/or the physical distance between the transmitter 305A and the receiver 310B are each less than about 500 times the wavelength of the light or the information-bearing optical signals received by the receiver 310B. Accordingly, the optical bus 150 can transmit information between devices situated within the aforementioned distances of one another.

In certain exemplary embodiments, the length of the lasing cavity 300A and/or the physical distance between the transmitter 305A and the receiver 310B are each in a range between about 1,000 and 10,000 times the wavelength of the light (or the information-bearing optical signals) received by the receiver 310B. In certain exemplary embodiments, the length of the lasing cavity 300A and/or the physical distance between the transmitter 305A and the receiver 310B are each in a range between about 5,000 and 100,000 times the wavelength of the light or the information-bearing optical signals received by the receiver 310B. In certain exemplary embodiments, the length of the lasing cavity 300A and/or the physical distance between the transmitter 305A and the receiver 310B are each in a range between about 5,000 and 10,000 times the wavelength of the light or the information-bearing optical signals received by the receiver 310B. In certain exemplary embodiments, the length of the lasing cavity 300A and/or the physical distance between the transmitter 305A and the receiver 310B are each in a range between about 10,000 and 50,000 times the wavelength of the light or the information-bearing optical signals received by the receiver 310B. In certain exemplary embodiments, the length of the lasing cavity 300A and/or the physical distance between the transmitter 305A and the receiver 310B are each in a range between about 3,000 and 8,000 times the wavelength of the light or the information-bearing optical signals received by the receiver 310B. In certain exemplary embodiments, the length of the lasing cavity 300A and/or the physical distance between the transmitter 305A and the receiver 310B are each in a range between about 5,000 and 25,000 times the wavelength of the light or the information-bearing optical signals received by the receiver 310B. In certain exemplary embodiments, the length of the lasing cavity 300A and/or the physical distance between the transmitter 305A and the receiver 310B are each in a range between about 500 and 1,000 times the wavelength of the light or the information-bearing optical signals received by the receiver 310B. Accordingly, the optical bus 150 can transmit information between devices situated within the aforementioned distances of one another.

In certain exemplary embodiments, the length of the optical cavity 300A, the physical distance between the transmitter 305 and the receiver 310B, the length of the communication channel, the length of the optical bus 150, or the distance between a message sender and a message recipient is less than the coherency length of the information-transmitting light. In certain exemplary embodiments, the length of the optical cavity 300A, the physical distance between the transmitter 305 and the receiver 310B, the length of the communication channel, the length of the optical bus 150, or the distance between a message sender and a message recipient is within two to ten times the coherency length of the information-transmitting light. In certain exemplary embodiments, the length of the optical cavity 300A, the physical distance between the transmitter 305 and the receiver 310B, the length of the communication channel, the length of the optical bus 150, or the distance between a message sender and a message recipient is within two to five times the coherency length of the information-transmitting light. In certain exemplary embodiments, the length of the optical cavity 300A, the physical distance between the transmitter 305 and the receiver 310B, the length of the communication channel, the length of the optical bus 150, or the distance between a message sender and a message recipient is within a range of one-half to one times the coherency length of the information-transmitting light. In certain exemplary embodiments, the length of the optical cavity 300A, the physical distance between the transmitter 305 and the receiver 310B, the length of the communication channel, the length of the optical bus 150, or the distance between a message sender and a message recipient is within a range of one-tenth to one-half the coherency length of the information-transmitting light.

The term "coherency length," as used herein, generally refers to a parameter of laser light that can be computed as the speed of the laser light divided by the line width of the laser light.

Figure 5:
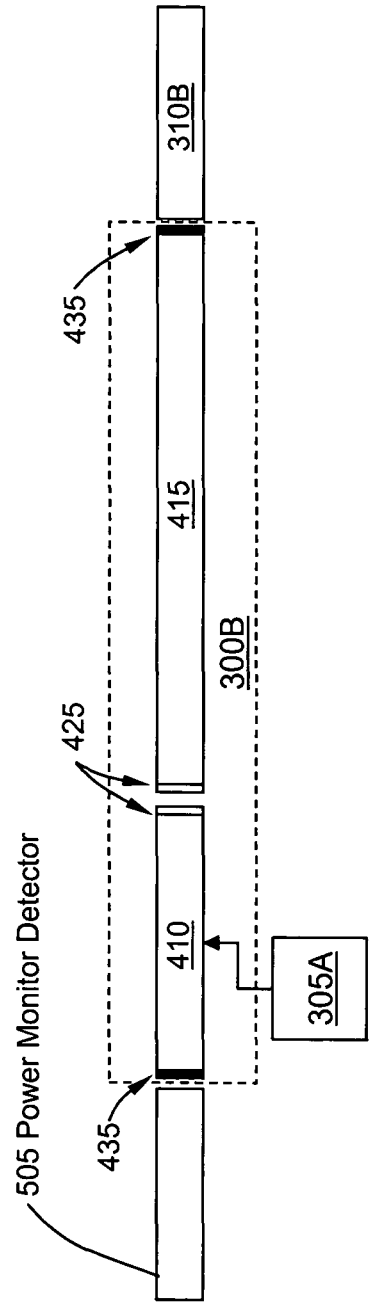
FIG. 5 is a schematic of a lasing cavity providing an optical communication channel in accordance with certain exemplary embodiments of the present invention.

Turning now to FIG. 5, this figure illustrates a schematic of an exemplary lasing cavity 300B providing an optical communication channel according to certain embodiments of the present invention. The lasing cavity 300B that FIG. 5 illustrates provides an exemplary embodiment of each of the lasing cavities 300 illustrated in FIG. 3 and discussed above. Thus, FIG. 5 illustrates an exemplary lasing cavity 300B that is an alternative to the lasing cavity 300A of FIG. 4 discussed above.

The lasing cavity 300B of FIG. 5 comprises a gain medium 410 and a section of waveguide 415 having a partially reflective coating 435 at the end facing the receiver 310B and an AR coating on the opposite end. The gain medium 410 comprises an AR coating at the end that faces the section of waveguide 415 and a partially reflective coating 435 at the opposite end. The lasing cavity 300B extends between the partially reflective coating 435 adjacent the transmitter 305A and the partially reflective coating 435 adjacent the receiver 310B. Further, the lasing cavity 300B extends through the gain medium 410 and the section of waveguide 415.

The partially reflective coating 435 adjacent the transmitter 305A typically transmits at least some light for receipt by the power monitor detector 505. For example, the partially reflective coating 435 can have a reflectivity in a range of between about 95 and 98 percent (and a corresponding transmission in a range of between about 2 and 5 percent). Accordingly, some light escapes the lasing cavity 300B, and the power monitor detector 505 converts that escaping light into an electrical signal. Accordingly, the power monitor detector 505 outputs a signal indicative of the state of the lasing cavity 300B. The signal can be used for controlling the lasing cavity 300B and/or to provide an indication of cavity status, for example.

The transmitter 305A issues signals to the gain medium 410 for transmission over the lasing cavity 300B to the receiver 310B. The lasing cavity 300B responds to those signals and changes or modulates some aspect of the light emitting to the receiver 310B. In various exemplary embodiments, the emitted light can have modulated intensity, phase, amplitude, polarization, wavelength, coherency, direction, data rates, format, or some other property or parameter that can appropriately convey information. Thus, signals from the transmitter 305A propagate over the lasing cavity 300B and are detected by the receiver 310B. The lasing cavity 300B provides and comprises an exemplary optical communication channel.

In certain exemplary embodiments, the optical communication channel of the lasing cavity 300B can support a data rate of at least 10 gigabits per second (Gbs). In various embodiments, the data rate can be about 1.25 Gbs, 5 Gbs, 10 Gbs, 12.5 Gbs, 20 Gbs, 30 Gbs, 40 Gbs, 50 Gbs, 60 Gbs, 100 Gbs, 150 Gbs, or 200 Gbs, or in a range between two of these data rates.

In one exemplary embodiment, the gain medium 410 comprises a Fabry-Perot laser die in which one facet is coated with an AR coating 425. Thus, in one exemplary embodiment, the lasing cavity 300B can be an external cavity laser with the transmitter 305A comprising a laser driver circuit. The transmitter 305A can set the gain medium 410 slightly above lasing threshold and then modulate the drive current so as to encode or imprint information. The gain medium 410 thus provides a modulated level of gain, outputs a modulated level of light, and/or stimulates a modulated level of emissions of radiation. In one exemplary embodiment, the lasing cavity 300B avoids breaking lasing threshold during modulation of the drive current. More generally, the transmitter 305A encodes or imprints information via prompting the lasing cavity 300B to change from a steady state condition to another condition.

Alternatively, under modulation, the drive current can dip so as to cause a substantially nonlinear response (or highly nonlinear response) from the lasing cavity 300B. For example, during a modulation cycle, the lasing cavity 300B can transition to a state near, below, or at the lasing threshold. The modulated drive current can trigger a wave or perturbation in the lasing cavity 300B that the receiver 310B detects and associates with an information state or a "symbol." For example, the lasing cavity 300B can response abruptly to a small change in the signal output from the transmitter 310B. Accordingly, the lasing cavity 300B can have at least two states, each representative of a digital state and each producing a corresponding digital state of light emission that the receiver 310B detects. In other words, light emitted from the lasing cavity 300B can have two or more discrete levels to provide information encoding, such as optical signals with binary or tertiary encoding. However, in certain embodiments, the optical signals transmitting over the lasing cavity 300B are analog rather than digital, for example providing a continuum of intensities.

The term "perturbation," as used herein, generally refers to (1) an influence on a system that causes the system to deviate or change at least slightly or (2) a deviation or change (which may be slight) of a system caused by an influence. The term "perturb," as used herein, generally refers to causing a system to deviate or change at least slightly.

The transmitter 305A can perturb the lasing cavity 300B so that roundtrip gain of the lasing cavity 300B remains in excess of roundtrip loss throughout the perturbation. Alternatively, perturbing the lasing cavity 300B can comprise causing roundtrip gain to briefly fall below roundtrip loss, for example in an incursion lasting less than about one nanosecond.

Figure 6:
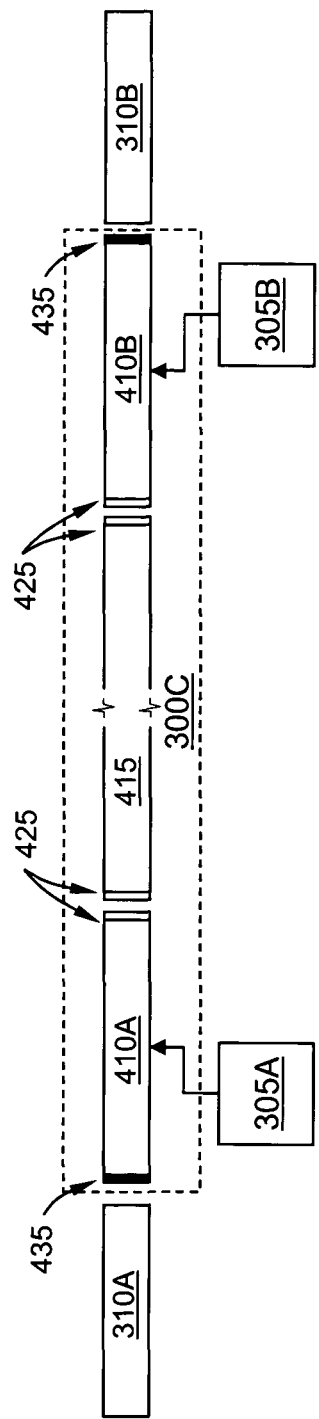
FIG. 6 is a schematic of a lasing cavity supporting bidirectional optical communication in accordance with certain exemplary embodiments of the present invention.

Turning now to FIG. 6, this figure illustrates a schematic of an exemplary lasing cavity 300C supporting bidirectional optical communication according to certain embodiments of the present invention. The lasing cavity 300C generally incorporates the functionality of both of the lasing cavities 300 illustrated in FIG. 3 and discussed above. Accordingly, the lasing cavity 300C provides an optical channel over which the core 1 101 can send information to the core 2 102 and the core 2 102 can send information to the core 1 101.

As further discussed below, in certain exemplary embodiments, the transmitter 305A and the transmitter 305B take turns using the lasing cavity 300C, so that at any one time only one of those transmitters 305A, 305B is transmitting over the lasing cavity 300C. In certain other exemplary embodiments, also discussed below, the transmitter 305A and the transmitter 305B can use the lasing cavity 300C simultaneously.

The lasing cavity 300C comprises two gain media 410A, 410B, each of which can operate generally as discussed above with reference to FIGS. 4 and 5. The transmitter 305A controls the gain medium 410A, while the transmitter 305B controls the gain medium 410B. The lasing cavity 300C has two signal input ports or inlets, one for the gain medium 410A associated with the transmitter 305A, and one for the gain medium 410B associated with the transmitter 305B.

A section of waveguide 415 extends between the two gain media 410A, 410B. The optical interfaces between the gain medium 410A and the section of waveguide 415 are adapted to manage reflection, for example via AR coatings 425 that promote transmission. Similarly, the optical interfaces between the gain medium 410B and the section of waveguide 415 are adapted to manage reflection, for example via AR coatings 425 that promote transmission.

The end of the gain medium 410A opposite the section of waveguide 415 and the end of the gain medium 410B opposite the section of waveguide 415 are treated with partially reflective coatings 435 so that a portion of the incident light is reflected and another portion is transmitted.

In the embodiment in which the lasing cavity 300C provides unidirectional communications at any one time, the partially reflective coatings 435 can have substantially similar spectral properties or can be made to a generally common specification. Accordingly, during a time period in which the transmitter 305A is actively modulating the gain medium 410A, the lasing cavity 300C emits light through both partially reflective coatings 435. Thus, optical signals carrying information from the transmitter 305A are incident upon the receiver 310A and the receiver 310B. During this time period, the receiver 310A can function as a power monitor, and the receiver 310B is the recipient of those optical signals and the carried information.

During a time period in which the transmitter 305B is issuing signals to the gain medium 410B, the receiver 310B can monitor power (or operational status or some other operating parameter of the lasing cavity 300C), while the receiver 310A receives the issued signals and the information imprinted thereon.

Accordingly, optical signals emanating from the gain medium 410A in response to action of the transmitter 305A pass through the gain medium 410B. And, optical signals emanating from the gain medium 410B in response to action of the transmitter 305B pass through the gain medium 410A.

In one exemplary embodiment, the gain medium 410B is energized while the transmitter 305A is actively transmitting information. In various embodiments, the state of energization of the gain medium 410B can be below, at, or above the lasing threshold. In this situation, the gain medium 410B can amplify optical signals emanating from the gain medium 410A. Beyond amplification, the gain medium 410B can interact with those optical signals nonlinearly, for example producing an abrupt or marked change or effect. In one exemplary embodiment, signals emanating from the gain medium 410A trigger the gain medium 410B to change states, for example transitioning into a state of lasing or stimulated emission of radiation. Alternatively, the gain medium 410B can be dormant or in an un-energized state when the gain medium 410A is emanating optical signals in response to action of the transmitter 305A. Similarly, the gain medium 410A can be energized, partially energized, below lasing, at or near lasing threshold, or dormant while the transmitter 305B is issuing signals to the gain medium 410B.

The term "lasing threshold," as used herein, generally refers to the lowest excitation level at which a laser's output is mainly the result of stimulated emission rather than spontaneous emission.

As mentioned above, as an alternative to taking turns, in certain exemplary embodiments, the transmitters 305A and 305B can simultaneously use the lasing cavity 300C as an optical communication channel. In an exemplary embodiment, the two gain media 410A, 410B can have different gain profiles so that each one has a tendency to lase at a different wavelength. Alternatively, the two gain media 410A, 410B can have like gain profiles, at least from a material perspective.

The spectral characteristics of the partial reflectors 436 can also facilitate the lasing cavity 300C lasing at two wavelengths. For example, the gain medium 410A and the two partial reflectors 435 may support lasing at wavelength $\lambda_1$, while the gain medium 410B and the two partial reflectors 435 may support lasing at wavelength $\lambda_2$. For example, the partial reflector 435 of the gain medium 410A can have a reflectivity approaching 100 percent at the wavelength $\lambda_1$ and a lesser reflectivity (for example about 65, 70, 75, 80, 85, or 90 percent, or in a range between any two of those values) at the wavelength $\lambda_2$. Meanwhile, the partial reflector 435 of the gain medium 410B can have a reflectivity approaching 100 percent at the wavelength $\lambda_2$ and a lesser reflectivity (for example about 65, 70, 75, 80, 85, or 90 percent, or in a range between any two of those values) at the wavelength $\lambda_1$. Beyond encouraging the lasing cavity 300C to lase at two wavelengths, such reflectivities can release light of the appropriate wavelength to each receiver 310A, 310B.

Accordingly, in this embodiment, the lasing cavity 300C can operate as two lasing cavity in a common and overlapping physical geometry. The lasing cavity 300C can lase at the wavelength $\lambda_1$ via resonance at the wavelength $\lambda_1$ between the two partial reflectors 435, with light at the wavelength $\lambda_1$ reflecting from the partial reflector 435 adjacent the receiver 310A and emitting from the partial reflector 435 adjacent the receiver 310B. Meanwhile, the lasing cavity 300C can lase at the wavelength $\lambda_2$ via resonance at the wavelength $\lambda_2$ between the two partial reflectors 435, with light at the wavelength $\lambda_2$ reflecting from the partial reflector 435 adjacent the receiver 310B and emitting from the partial reflector 435 adjacent the receiver 310A.

In an exemplary embodiment, the wavelength $\lambda_1$ can be at about 1310 nanometers ("nm"), while the wavelength $\lambda_2$ is about 1550 nm. In another exemplary embodiment, the two wavelengths are both in a window of transmission around 1550 nm. In another exemplary embodiment, the two wavelengths are both in a window of transmission around 1310 nm. In yet another exemplary embodiment, the two wavelengths are both between about 600 and 1100 nm. The two wavelengths can be less than one nm apart, a few nm apart, tens of nm apart, or a hundred or more nm apart. Exemplary embodiments of the lasing cavity 300C can support wavelength division multiplexing ("WDM"), coarse wavelength division multiplexing ("CWDM"), or dense wavelength division multiplexing ("DWDM").

The partial reflectors 435 can each have wavelength-selective transmission and reflection, for example provided by an optical filter. An optical filter generally is a device, structure, system, or feature providing light transmission and/or light reflection that varies according to light frequency, wavelength, or color. Various embodiments of filters can manipulate or manage light via diffraction, refraction, interference, thin-film interference, interferometers, gratings, absorption, scattering, amplification, holography, etc.

In an exemplary embodiment, thin-film coatings provide the wavelength selectivity discussed above. That is, thin-film interference filters can reflect certain wavelengths of light while passing others. As an alternative to thin-film coatings, gratings can provide the wavelength selective properties, wherein a grating is a type of filter as the term "filter" is used herein. Such gratings can be DFB gratings, distributed DBR gratings, fiber Bragg gratings, Bragg gratings, diffraction gratings, corrugated gratings, etched gratings, free space gratings, ruled gratings, volume gratings, holographic gratings, etc.

Figure 7A:
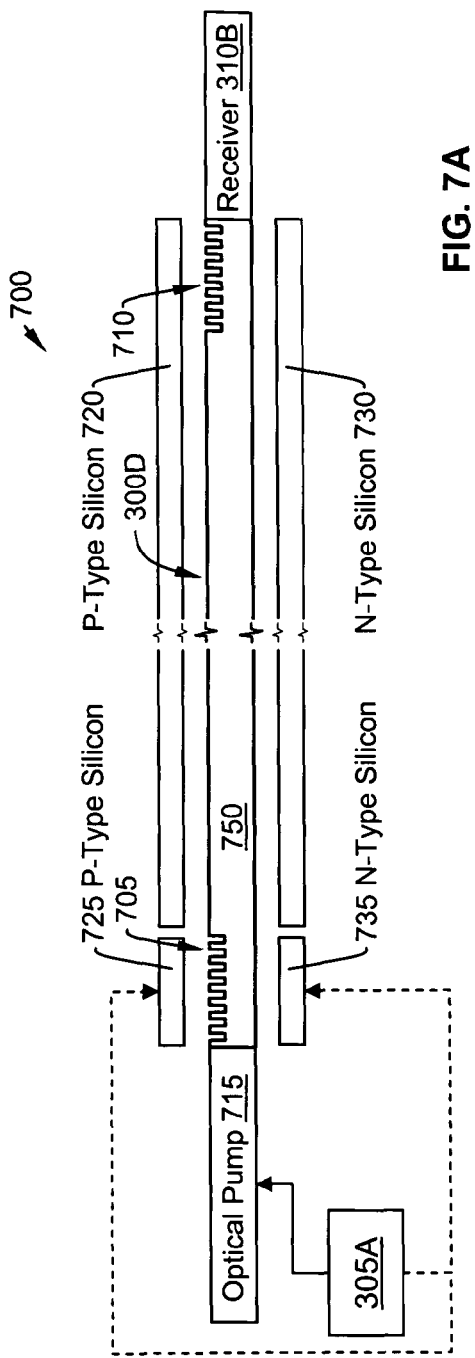
FIGS. 7A and 7B, collectively FIG. 7, respectively are a schematic and a cross sectional illustration of an optically pumped lasing cavity providing an optical communication channel in accordance with certain exemplary embodiments of the present invention.
Figure 7B:
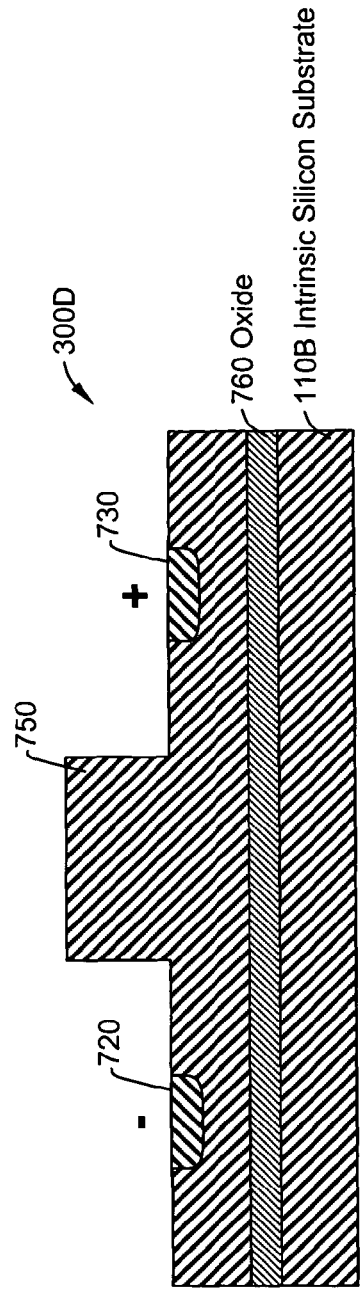

Turning now to FIGS. 7A and 7B, these figures respectively illustrate a schematic and a cross sectional view of an exemplary optically pumped lasing cavity 300D providing an optical communication channel according to certain embodiments of the present invention. The lasing cavity 300D illustrated in FIG. 7 represents certain exemplary embodiments of each of the lasing cavities 300 illustrated in FIG. 3 and discussed above. Thus, FIG. 7 describes an optical communication system 700 comprising an exemplary lasing cavity 300D that can be utilized to communicate over an optical bus 150 and/or to provide an optical network 175 as discussed above.

The optical communication system 700 comprises a substrate 110B as an exemplary embodiment of the substrate 110 illustrated in FIG. 1 and discussed above. In an exemplary embodiment, the substrate 110B has a composition of intrinsic, undoped, and/or monolithic silicon. The various elements illustrated in FIG. 7 can be grown on or otherwise integrated with the substrate 110B, for example. An oxide layer 760 covers the substrate 110B. The oxide layer 760 typically has a composition that includes (or that substantially is) silicon dioxide ($SiO_2$) or/and silicon monoxide (SiO). In an exemplary embodiment, the oxide layer 760 can be considered buried.

The waveguide 750, typically comprising or essentially consisting of silicon, is disposed over the oxide layer 760. In an exemplary embodiment, the waveguide 750 comprises a single-mode rib waveguide providing a modal dimensions on the order of about one micron by about one half square microns. In an exemplary embodiment, the waveguide 750 is fabricated on an undoped silicon-on-insulator substrate via photolithography and reactive ion etching.

The waveguide 750 extends between reflectors 705, 710 that provide the lasing cavity 300D via reflecting light back and forth between one another. Circulating light makes successive roundtrip journeys between the two reflectors 705, 710 and thus flows repeatedly (for example as a standing wave) through the waveguide 750. In an exemplary embodiment, the reflectors 705, 710 are gratings comprising grooves or corrugations etched into the top surface of the waveguide 750. In an exemplary embodiment, the reflector 705 has reflectivity at the lasing wavelength (of the lasing cavity 300D) approaching or about equaling 100 percent. Meanwhile, the reflector 710 has a lower reflectivity, for example 60 to 95 percent as discussed above, so that lasing light can readily escape the lasing cavity 300D for receipt by the receiver 310B. As discussed above, the receiver 310B typically comprises a detector that converts incident light into the electrical domain for subsequent signal processing and decoding. Also as discussed above, in certain exemplary embodiments, the receiver 310B can perform a spectral analysis on the incident light and may comprise an optical spectrum analyzer, for example.

The optical pump 715 emits light into the waveguide 750 to energize the lasing cavity 300D, for example stimulating lasing via Raman scattering or the Raman effect. Thus, the optical pump 715 can comprise a laser that emits light at a different wavelength than the lasing wavelength of the lasing cavity 300D and that pumps the lasing cavity 300D to a lasing state. Accordingly, the waveguide 750 comprises a gain medium (and further provides an optical communication channel). In certain exemplary embodiments, the waveguide 750 provides the combined functions of the section of waveguide 415 and the gain medium 410 illustrated in FIG. 4 and discussed above. The reflector 705 typically has a relatively high transmission, for example greater than 95 percent or greater than 99 percent, at the wavelength of the pump light to facilitate passage of pump light into the lasing cavity 300D.

In certain exemplary embodiments, the reflector 710 has a high reflectivity, for example greater than 95 percent or greater than 99 percent at the pump wavelength, so that pump light incident upon the reflector 710 reflects back towards the optical pump 715. In this manner, at least some pump light makes two or more passes through the waveguide 750. In certain exemplary embodiments, the optical pump 715 comprises a lasing cavity that extends from a rear reflector of a pump laser to the reflector 710. Accordingly, pump light can circulate through a gain medium of the optical pump as well as through the waveguide 750. Alternatively, the reflector 705 can provide a front reflector for the optical pump. Accordingly, the optical pump 715 can comprise a lasing cavity either that overlaps the lasing cavity 300D or that is distinct from the lasing cavity 300D. Also, the reflector 705 can operate both as a front reflector for the lasing cavity of the optical pump 715 and as a rear reflector for the lasing cavity 300D, which comprises an optical communication channel in an exemplary embodiment. Thus, the optical pump lasing cavity can substantially adjoin the lasing cavity 750 without substantially overlapping one another.

The optical communication system 700 comprises a section of P-type silicon 720 and a section of N-type silicon 730, each extending alongside the waveguide 750, for controlling electron-hole pairs in the waveguide 750 to facilitate lasing activity. Typically, the P-type silicon 720 is separated from the waveguide 750 by about two microns, and the N-type silicon 730 is also separated from the waveguide 750 by about two microns. Various other dimensions are available. The P-type and N-type silicon can be formed via boron and phosphorous implantation, for example.

The P-type silicon 720 and the N-type silicon 730 provide a "PiN" diode structure running along the waveguide 750. Applying electricity to the section of P-type silicon 720 and the section of N-type silicon 730 facilitates pumping the waveguide 750 to a lasing state. In other words, the section of P-type silicon 720 and the section of N-type silicon 730 support lasing of the waveguide 750 with a composition of intrinsic or essentially pure silicon or a composition based on silicon. In an exemplary embodiment, the PiN diode structure is reverse biased so that an electric field removes electron-hole pairs (generated via two photon absorption, for example) from the waveguide 750 to facilitate lasing activity and/or to enhance the gain of the waveguide 750.

The optical communication system 700 also comprises another section of P-type silicon 725 and another section of N-type silicon 735 that are controlled by the transmitter 305A. The sections of P- and N-type silicon 725, 735 can be isolated electrically (at least partially isolated) from the sections of P- and N-type silicon 720, 730. The sections of P- and N-type silicon 725, 735 are similar to the sections of P- and N-type silicon 720, 730; however, the section of P- and N-type silicon 725, 735 are typically disposed at the transmitter end of the lasing cavity 300D. Thus, the sections of P- and N-type silicon 725, 735 provide a second PiN diode structure that interacts with the lasing cavity 300D and can manipulate electron-hole pairs in the waveguide 750 to control cavity gain and/or lasing. The gain or lasing control can be specific to the region of the waveguide 750 adjacent P- and N-type silicon 725, 734. Alternatively, the control can affect total gain of the lasing cavity 300D.

In an exemplary embodiment, the transmitter 305A emits information-bearing signals onto the lasing cavity 300D for transmission to the receiver 310B via modulating the section of P-type silicon 725 and the section of N-type silicon 735. For example, the transmitter 305A can modulate the reverse bias level of the PiN diode structure. In certain exemplary embodiments, the transmitter 305A can implement periods of zero bias and/or incursions of positive bias. More generally, the modulation can comprise changing the current and/or voltage to the section of P-type silicon 725 and the section of N-type silicon 735 so as to manipulate the lasing cavity 300D in a manner that transmits information to the receiver 310B.

The change in the electrical supply impacts gain (or loss) in the lasing cavity 300D, for example a portion of the lasing cavity 300D adjacent the section of P-type silicon 725 and the section of N-type silicon 735. The transmitter-induced change can thereby propagate or ripple through the lasing cavity 300D for detection at the receiver 310B. In certain exemplary embodiments, the sections of P- and N-type silicon 720, 730 establish a steady state operating condition of the lasing cavity 300D, while the sections of P- and N-type silicon 725, 735 perturb the lasing cavity 300D from steady state in response to transmitter input.

As an alternative to transmitting information via modulating the P-type silicon 725 and the N-type silicon 735, the optical communication system 700 can communicate via modulating the optical pump 715. Thus, the transmitter 305A may communicate via issuing signals to either of (or potentially both of) the optical pump 715 and the sections of P- and N-type silicon 725, 735. FIG. 7A depicts one signal path (solid line) between the transmitter 305A and the optical pump 715 and another signal path (dashed line) between the transmitter 305A and the sections of P- and N-type silicon 725, 735 to illustrate that the transmitter 305A can modulate either or both of the optical pump 715 and the sections of P- and N-type silicon 725, 735.

In an alternative to the embodiment illustrated in FIG. 7 and discussed above, the waveguide 750 of the lasing cavity 300D can receive light from a laser made from a group III-V semiconductor material such as indium phosphide or gallium arsenide that is disposed on top of the waveguide 750. In other words, rather than disposing the optical pump 715 at the transmitter end of the waveguide 750 (as illustrated in FIG. 7), an optical pump can be disposed over the waveguide 750. The waveguide's silicon can be fused to an active light emitting wafer via "hybrid-silicon" technology. Emitted light from the indium phosphide couples into the waveguide 750 and resonates between the reflectors 705, 710. Similar to the embodiment of FIG. 7A, the sections of P- and N-type silicon 720, 730 provide broad gain control to facilitate lasing, while transmitter 305 issues signals into or onto the lasing cavity 300D via modulating the reverse bias of the sections of P- and N-type silicon 725, 735.

Figure 8:
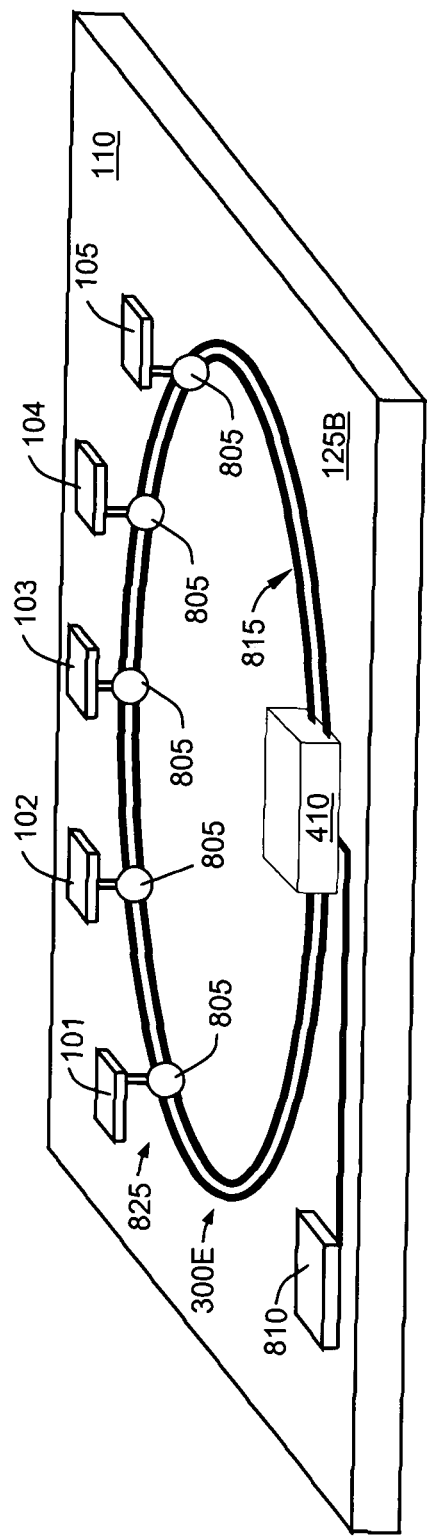
FIG. 8 is an illustration of a multicore processor comprising a lasing cavity providing an optical communication ring for multiple cores in accordance with certain exemplary embodiments of the present invention.

Turning now to FIG. 8, this figure illustrates a multicore processor 125B comprising an exemplary lasing cavity 300E providing an optical communication ring 825 for multiple cores 101, 102, 103, 104, 105 according to certain embodiments of the present invention. Thus, FIG. 8 illustrates an embodiment for communicating over a lasing cavity 300E in exemplary operating environment of a multicore computing application.

The optical communication ring 825 (as well as the lasing cavity 300E) comprises a pair of waveguides 815 (a waveguide pair) that are ring-shaped. A gain medium 410 is disposed in the optical path of each waveguide in the waveguide pair 815. For example, the gain medium 410 can comprise two gain elements, one for each waveguide in the waveguide pair 815.

When energized, the gain medium 410 emits light into each waveguide in the waveguide pair 815. That light loops back onto itself as it circulates around the communication ring 825. In other words, one end of the waveguide pair 815 is coupled to (for example butted up to) one end of the gain medium 410, while the other end of the waveguide pair 815 is coupled to (for example butted up to) the other end of the gain medium 410. In this manner, the waveguide pair 815 and the gain medium 410 form a ring-shaped lasing cavity 300E that essentially closes upon itself (geometrically). More specifically, two concentric ring-shaped lasing cavities 300E are formed, as the gain medium 410 and the waveguide pair 815 form two light paths. In certain exemplary embodiments, those two light paths may operate independently or be isolated from one another so that a perturbation on one path remains within that path. In certain other exemplary embodiments, the two light paths are coupled functionally together at the gain medium 410 so that a perturbation on one path may influence the other path.

Each of the cores 101, 102, 103, 104, 105, is linked to the waveguide pair 815 (and thus to the optical cavity 300E) via a respective coupler 805. Each coupler 805 can comprise an optical tap or other suitable provision for directing light into and/or out of the waveguide pair 815. Thus, the couplers 805 and associated bus interfaces (not illustrated as individual elements in FIG. 8 but shown in exemplary form in other figures and discussed above) provide a ring interface. In other words, each coupler 805 diverts light from at least one waveguide of the waveguide pair 815 to one of the cores 101, 102, 103, 104, 105 for conversion into a corresponding electrical signal.

The processing controller 810 generates timing pulses and other processing instructions that are communicated to the cores 101, 102, 103, 104, 105 over the lasing cavity 300E. In certain exemplary embodiments, the processing controller 810 can be or can comprise a clock for synchronizing or otherwise timing operations of the cores 101, 102, 103, 104, 105. In an exemplary embodiment, the processing controller 810 modulates the gain medium 410 so as to coordinate actions, activities, or processes executing on the respective cores 101, 102, 103, 104, 105. Modulation of the gain medium 410 can proceed as discussed above with respect to various ones of FIGS. 1-7, for example. Thus, the processing controller 810 is an exemplary embodiment of a transmitter 305 for communicating information via the lasing cavity 300E.

In certain exemplary embodiments, one waveguide of the waveguide pair 815 sends information from the processing controller 810 to the cores 101, 102, 103, 104, 105, while the other waveguide of the waveguide pair 815 sends information from one or more of the cores 101, 102, 103, 104, 105 to the processing controller 810. Information received by the processing controller 810 can comprise status information, job completion information, processing results, flags, etc. In certain exemplary embodiments, one of the waveguides of the waveguide pair 815 supports core-to-core communications, while the other waveguide of the waveguide pair 815 supports bidirectional communication with the processing controller 810.

In certain exemplary embodiments, the multicore processor 125B is implemented in a silicon-based material system or via hybrid-silicon technology as discussed above with reference to FIG. 7. Accordingly, the substrate 110 can comprise intrinsic, un-doped, or essentially pure silicon, for example in crystalline form.

Turning now to FIG. 9, this figure illustrates a flowchart of an exemplary process 900 for communicating information over an optical path in which lasing occurs according to certain embodiments of the present invention. Process 900, which is entitled "Communicate via Lasing Cavity," will be discussed largely with exemplary reference to FIG. 7. Those with ordinary skill in the art having benefit of this disclosure will appreciate that such reference provides but one example, that process 900 is one example out of many others supported by this teaching, and that the present disclosure describes and teaches a wide range of processes and methods for making and using exemplary embodiments of the present invention.

Certain steps in process 900, as well as the other methods and processes disclosed and taught herein, must naturally precede others for the present invention to function as described. However, the present invention is not limited to the order of the steps described if such order or sequence does not adversely alter the functionality of the present invention. That is, it is recognized that some steps may be performed before or after other steps or in parallel with other steps without departing from the scope and spirit of the present invention.

At step 905 of process 900, structure of the lasing cavity 300D is fabricated so as to extend substantially between a sender and a recipient, such as from the core 1 101 to the core 2 102 of the multicore processor 125. For example, a waveguide 750 can be formed (e.g. grown, deposited, bonded, etc.) on an oxide layer 760 of a silicon substrate 110B in a silicon-on-insulator configuration, with the cores 101, 102, 103, 104, 105 also integrated on the same silicon substrate 110B. Etched gratings on each end of the waveguide 750 provide reflectors 705, 710 for resonating or circulating light within the lasing cavity 300D. As discussed above with reference to FIG. 7, sections of P- and N-type silicon 720, 730 are also disposed on the silicon substrate 110B to facilitate efficient lasing.

At step 910, an energy source is coupled to the lasing cavity 300D. As discussed above, an indium phosphide wafer capable of emitting pump light can be bonded to the top of the waveguide 750 (opposite the oxide layer 760) via plasma assisted wafer bonding. The waveguide 750 and the indium phosphide wafer are exposed to an oxygen plasma. The indium phosphide wafer and the surface of the waveguide 750 are brought into contact with one another. Pressing the two surfaces together for approximately ten to fifteen hours at a temperature of 250 to 350 degrees Centigrade can fuse the indium phosphide wafer to the waveguide 750. The indium phosphide wafer can be subsequently processed, for example via etching and attaching electrical contact pads, to facilitate wire bonding or other electrical connections. With this attachment approach, the indium phosphide can pump the lasing cavity 300D via either laser light emissions or spontaneous emissions, for example.

At step 915, the coupled energy source is energized. For example, the bonded indium phosphide light emitter emits light into the waveguide 750 thereby optically pumping the lasing cavity 300D. In certain exemplary embodiments, the bonded indium phosphide provides a lasing cavity for pump light extending above the waveguide 750, essentially parallel to the waveguide 750. When the pump lasing cavity is energized, pump light (typically, but not necessarily, of a different wavelength than the laser light carrying information over the lasing cavity 300D) couples into the lasing cavity 300D to pump the lasing cavity 300D to a lasing state. In other words, the pump light circulates on the side of the waveguide 750 that is opposite the oxide layer 760, flowing essentially parallel to the light circulating in the lasing cavity 300D. The circulating pump light couples into the waveguide 750, for example via evanescent wave coupling or via an optical coupler. As discussed above with reference to FIG. 7, the reflectors 705, 710 can have spectrally selective reflectivity so that the coupled pump light resonates within the lasing cavity 300D.

In an alternative exemplary embodiment, the bonded indium phosphide provides a vertical lasing cavity for the pump light, wherein the pump light lasing cavity extends through the longitudinal axis of the waveguide 750. For example, the pump light lasing cavity can include one cavity reflector disposed under the waveguide 750 and another cavity reflector disposed over the waveguide 750, wherein the indium phosphide gain medium of the pump laser is above the waveguide 750. The two reflectors and the gain medium can each extend along the waveguide 750, lengthwise. In this embodiment, the pump light and the information-bearing light can be substantially perpendicular to one another.

At step 920, the transmitter 305A issues information bearing signals into or onto the lasing cavity 300D. As discussed above, the transmitter 305A can issue a sequence of pulses, analog signals, discrete signals, digital signals, etc. For example, the transmitter 305A can modulate the bias of sections of P- and N-type silicon 725, 735 as discussed above with reference to FIG. 7. Alternatively, the transmitter 305A can modulate the energy source that is pumping the lasing cavity 300D. As discussed above, in various embodiments, the transmitter 305A can modulate an electrical supply to a gain medium 410, a light supply, or a pump laser. In other embodiments, the transmitter 305A can modulate an element that interacts with or disturbs light resonating within the lasing cavity 300D. Such an element may comprise a refractive index modulator 405 or a device with controllable light attenuation, controllable phase, controllable polarization properties, etc.

At step 925, the signals issued by the transmitter 305A into the lasing cavity 300D invoke a response from the lasing cavity 300D and/or from the light that is in the lasing cavity 300D. For example, the signals can perturb the lasing cavity 300D and/or that light of the lasing cavity 300D via causing some change that is perceptible by the receiver 310B. Change induced by the transmitter 305A propagates within the lasing cavity 300D towards the receiver 310B and the information recipient (which can be the receiver 310B).

At step 930, light emits from the lasing cavity 300D and is incident on the receiver 310B. Thus, information bearing optical signals have propagated over the lasing cavity 300D to the receiver 310B.

At step 935, the receiver 310B processes the light emitted from the lasing cavity 300D. In an exemplary embodiment, the receiver 310B converts the emitted light into a corresponding electrical signal. For example, the receiver 310B emits an electrical signal that is encoded or imprinted with the information that the transmitter 305A issued onto the lasing cavity 300D. In various exemplary embodiments, the receiver 310B can comprise a spectrum analyzer, an interferometer, an avalanche photodiode ("APD"), a pin photodiode, a silicon detector, a dispersive element, a grating, a diffractive element, a detector array, or a charge coupled device ("CCD"), to name a few examples.

Signal processing in the electric domain can comprise applying analog signal processing, digital signal processing ("DSP"), application specific integrated circuits ("ASICs"), computational routines, triggers, amplifiers, tunable filters, differential amplifiers, high-speed filters, finite impulse response filters ("FIRs"), phase locked loops ("PLLs"), signal conditioning circuitry, analog-to-digital conversion circuits, Kalman filtering, or other applicable signal processing techniques or devices.

At step 940, the receiver 310B typically feeds the processed electrical signal to a decoder. In an exemplary embodiment, the decoder changes serial data transmitting over one line to a parallel data stream transmitting over multiple line. Converting from single-line transmission to multi-line transmission can provide a slower bit rate on any single line to facilitate data handling and transmission with peripheral devices or other systems, for example. However, in many exemplary embodiments and applications, the signal may be useful to the recipient without decoding and/or without conversion into a parallel format. In any event, the recipient utilizes the information transmitted over the lasing cavity 300D. As discussed above, the core 2 102 can use the information to support computer operations.

Following step 940, process 900 loops back to step 920 to iterate steps 920 through 940. Accordingly, communication over the lasing cavity 300A is ongoing or sustained, for example to support long-term exchange of information.

In view of the foregoing, certain exemplary embodiments of the present invention will now be further discussed.

Certain exemplary embodiment of the present invention can comprise a method for transmitting communications between a first location and a second location, comprising the steps of: at the first location, perturbing a lasing cavity that extends substantially between the first location and the second location; and at the second location, detecting the perturbation. Certain exemplary embodiments can comprise that method, wherein the perturbing step comprises at the first location, perturbing the lasing cavity in a pattern representative of the communications, and wherein the detecting step comprises at the second location, receiving the communications in response to detecting the pattern. Certain exemplary embodiments can comprise that method, wherein the first location and the second location are disposed on a common substrate. Certain exemplary embodiments can comprise that method, wherein a first processor that is attached to a substrate comprises the first location, and wherein a second processor that is attached to the substrate comprises the second location. Certain exemplary embodiments can comprise that method, further comprising the step of optically pumping the optical cavity. Certain exemplary embodiments can comprise that method, wherein perturbing the lasing cavity comprises emitting an optical signal into the lasing cavity.

Certain exemplary embodiments of the present invention can comprise a method of transmitting a message from a sender to a recipient, comprising the steps of: placing the message on a lasing cavity adjacent the sender; and receiving the message from the lasing cavity adjacent the recipient. Certain exemplary embodiments can comprise that method, further comprising the step of optically pumping the lasing cavity, wherein placing the message on the lasing cavity comprises introducing a sequence of disturbances onto the lasing cavity. Certain exemplary embodiments can comprise that method, wherein placing the message on the lasing cavity comprises emitting light into the lasing cavity.

Certain exemplary embodiments of the present invention can comprise a process for communicating from a first location to a second location, comprising: energizing a lasing cavity that extends substantially between the first location and the second location; at the first location, issuing a sequence of signals to the energized lasing cavity; and at the second location, sensing the sequence of issued signals. Certain exemplary embodiments can comprise that process, wherein the first location and the second location are disposed on a single silicon substrate. Certain exemplary embodiments can comprise that process, wherein the sequence of signals comprises two types of signals, each representing a distinct digital state. Certain exemplary embodiments can comprise that process, wherein the sequence of signals are operative to convey analog information. Certain exemplary embodiments can comprise that process, wherein the sequence of signals are operative to convey digital data. Certain exemplary embodiments can comprise that process, wherein the lasing cavity comprises a silicon waveguide.

Certain exemplary embodiments of the present invention can comprise a communication system comprising: an optical path extending between two reflectors and comprising an optical gain medium disposed between the two reflectors; a first port, connected to the optical path between the two reflectors, operable to introduce a communication signal to the optical path for transmission to a recipient; and a second port, connected to the optical path between the two reflectors, operable to feed at least some form of the introduced communication signal to the recipient, wherein the recipient is adjacent the second port, wherein the two reflectors are operable to resonate light between one another. Certain exemplary embodiments can comprise that communication system, wherein the optical gain medium comprises an optical amplifier. Certain exemplary embodiments can comprise that communication system, wherein the first port is connected to the optical path adjacent a first of the two reflectors, and wherein the second port is connected to the optical path adjacent a second of the two reflectors. Certain exemplary embodiments can comprise that communication system, wherein a lasing cavity comprises the optical path, the two reflectors, and the optical gain medium, wherein the second port is further operable to introduce a second communication signal to the optical path, and wherein the first port is further operable to feed at least some form of the introduced second communication signal to a second recipient adjacent the first port. Certain exemplary embodiments can comprise that communication system, further comprising a silicon substrate to which the optical path, the optical gain medium, the two reflectors, the first port, and the second port are integrated. Certain exemplary embodiments can comprise that communication system, further comprising a first processor core of a computing system connected to the first port and a second processor core of the computing system connected to the second port.

Certain exemplary embodiments of the present invention can comprise a communication method comprising: amplifying light circulating over an optical communication channel; issuing a signal onto the optical communication channel at a first site; and receiving the signal from the optical communication channel at a second site. Certain exemplary embodiments can comprise that communication method, wherein amplifying light circulating over the optical communication channel comprises stimulating light emissions on successive passes of the circulating light. Certain exemplary embodiments can comprise that communication method, wherein the steps of issuing the signal and receiving the signal collectively comprise communicating data from the first site to the second site. Certain exemplary embodiments can comprise that communication method, wherein the optical communication channel comprises a circuit, through which the light circulates, that extends at least between the first site and the second site, wherein a first core of a multicore processor is disposed at the first site, and wherein a second core of a multicore processor is disposed at the second site.

Certain exemplary embodiments of the present invention can comprise a communication system comprising: an optical circuit operable to circulate light at least between an inlet and an outlet; and a gain medium, disposed along the optical circuit, for amplifying the circulating light, wherein the inlet is operable to affect the circulating light in response to applying a sequence of inputs, representative of data, to the optical circuit, and wherein the outlet is operable to feed at least a portion of the affected circulating light to a receiver that is operable to identify at least a portion of the data.

Certain exemplary embodiments of the present invention can comprise a communication system comprising a lasing cavity that comprises an optical communication channel operative to transmit messages from a sender to a remote recipient. Certain exemplary embodiments can comprise that communication system, wherein the optical communication channel extends substantially from the sender to the remote recipient.

Technology has been disclosed and described in detail so as to enable one of ordinary skill in the art to make and use the technology without undue experimentation. Multiple exemplary embodiments have been described in detail in a manner to enable one of ordinary skill in the art to exchange elements or features of the described embodiments among one another. The present disclosure includes teaching how components and elements of one described embodiment can be substituted for corresponding components and elements of another described embodiment.

Technology for optical communication has been described. From the description, it will be appreciated that an embodiment of the present invention overcomes limitations of the prior art. Those skilled in the art will appreciate that the present invention is not limited to any specifically discussed application or implementation and that the embodiments described herein are illustrative and not restrictive. From the description of the exemplary embodiments, equivalents of the elements shown herein will suggest themselves to those skilled in the art, and ways of constructing other embodiments of the present invention will appear to ordinary practitioners of the art. Therefore, the scope of the present invention is to be limited only by the accompanying claims.

What is claimed is:

1. A communication system comprising:
a lasing cavity extending between a first reflector and a second reflector and comprising an optical gain medium and a passive medium disposed between the first and second reflectors, the second reflector being partially reflective;
a first port, connected to the lasing cavity and operable to introduce a communication signal into the lasing cavity for transmission to a recipient; and
a second port, connected to the lasing cavity by the second reflector, and operable to feed at least some form of the introduced communication signal to the recipient, wherein the recipient is adjacent the second port;
wherein the first reflector and second reflector are operable to resonate light between one another.

2. The communication system of claim 1, wherein the optical gain medium comprises an optical amplifier that is operable to amplify light via stimulated emission and that comprises semiconductor material.

3. The communication system of claim 1, wherein the two reflectors are separated from one another in a range between about five and twenty five millimeters.

4. The communication system of claim 1,
wherein the second port is further operable to introduce a second communication signal to the lasing cavity, and
wherein the first port is further operable to feed at least some form of the introduced second communication signal to a second recipient adjacent the first port.

5. The communication system of claim 1, further comprising a silicon substrate to which the optical gain medium, the passive medium, the two reflectors, the first port, and the second port are integrated.

6. The communication system of claim 1, further comprising a first processor core of a computing system connected to the first port and a second processor core of the computing system connected to the second port.

* * * * *